(12) United States Patent
Bayat et al.

(10) Patent No.: US 10,552,510 B2
(45) Date of Patent: Feb. 4, 2020

(54) VECTOR-BY-MATRIX MULTIPLIER MODULES BASED ON NON-VOLATILE 2D AND 3D MEMORY ARRAYS

(71) Applicant: Mentium Technologies Inc., Santa Barbara, CA (US)

(72) Inventors: Farnood Merrikh Bayat, Goleta, CA (US); Mirko Prezioso, Goleta, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 0 days.

(21) Appl. No.: 16/246,353

(22) Filed: Jan. 11, 2019

(65) Prior Publication Data

US 2019/0213234 A1   Jul. 11, 2019

Related U.S. Application Data

(60) Provisional application No. 62/616,365, filed on Jan. 11, 2018.

(51) Int. Cl.
*G06F 17/16* (2006.01)
*G11C 16/04* (2006.01)
*G06N 3/04* (2006.01)
*G11C 16/10* (2006.01)
*G06N 3/08* (2006.01)
(Continued)

(52) U.S. Cl.
CPC ............. *G06F 17/16* (2013.01); *G06N 3/04* (2013.01); *G06N 3/08* (2013.01); *G11C 7/1006* (2013.01); *G11C 11/54* (2013.01); *G11C 16/0425* (2013.01); *G11C 16/0466* (2013.01); *G11C 16/0483* (2013.01); *G11C 16/10* (2013.01); *G11C 16/26* (2013.01)

(58) Field of Classification Search
CPC ...... G06F 17/16; G11C 16/26; G11C 16/0483; G11C 16/10; G06N 3/08; G06N 3/04
See application file for complete search history.

(56) References Cited

U.S. PATENT DOCUMENTS

| 2017/0117291 A1* | 4/2017 | Or-Bach | H01L 23/5283 |
| 2019/0148393 A1* | 5/2019 | Lue | H01L 27/11556 365/185.05 |
| 2019/0164617 A1* | 5/2019 | Tran | G11C 16/3459 |

OTHER PUBLICATIONS

Merrikh-Bayat, et al., 'Memory Technologies for Neural Networks'. 2015 IEEE Int. Memory Workshop (IMW), 2015, pp. 1-4 (Year: 2015).*

* cited by examiner

*Primary Examiner* — Jerome Lebouef
(74) *Attorney, Agent, or Firm* — Maschoff Brennan

(57) ABSTRACT

Systems and methods for a vector-by-matrix multiplier (VMM) module having a three-dimensional memory matrix of nonvolatile memory devices each having a charge storage, an activation input, a signal input and an output signal in a range that is based on a stored charge and an input signal during assertion of the activation signal. The memory devices are arranged in two dimensional (XY) layers that are vertically disposed along (Z) columns. The activation inputs of each layer are connected to a same activation signal, the memory devices of rows in a first dimension (X) of each layer have signal inputs connected to different input signals and have signal outputs connected in series to a common output. The memory devices of rows in a second dimension (Y) of each layer have signal inputs connected to a set of the same inputs along the first dimension.

8 Claims, 28 Drawing Sheets

(51) Int. Cl.
  *G11C 16/26* (2006.01)
  *G11C 7/10* (2006.01)
  *G11C 11/54* (2006.01)

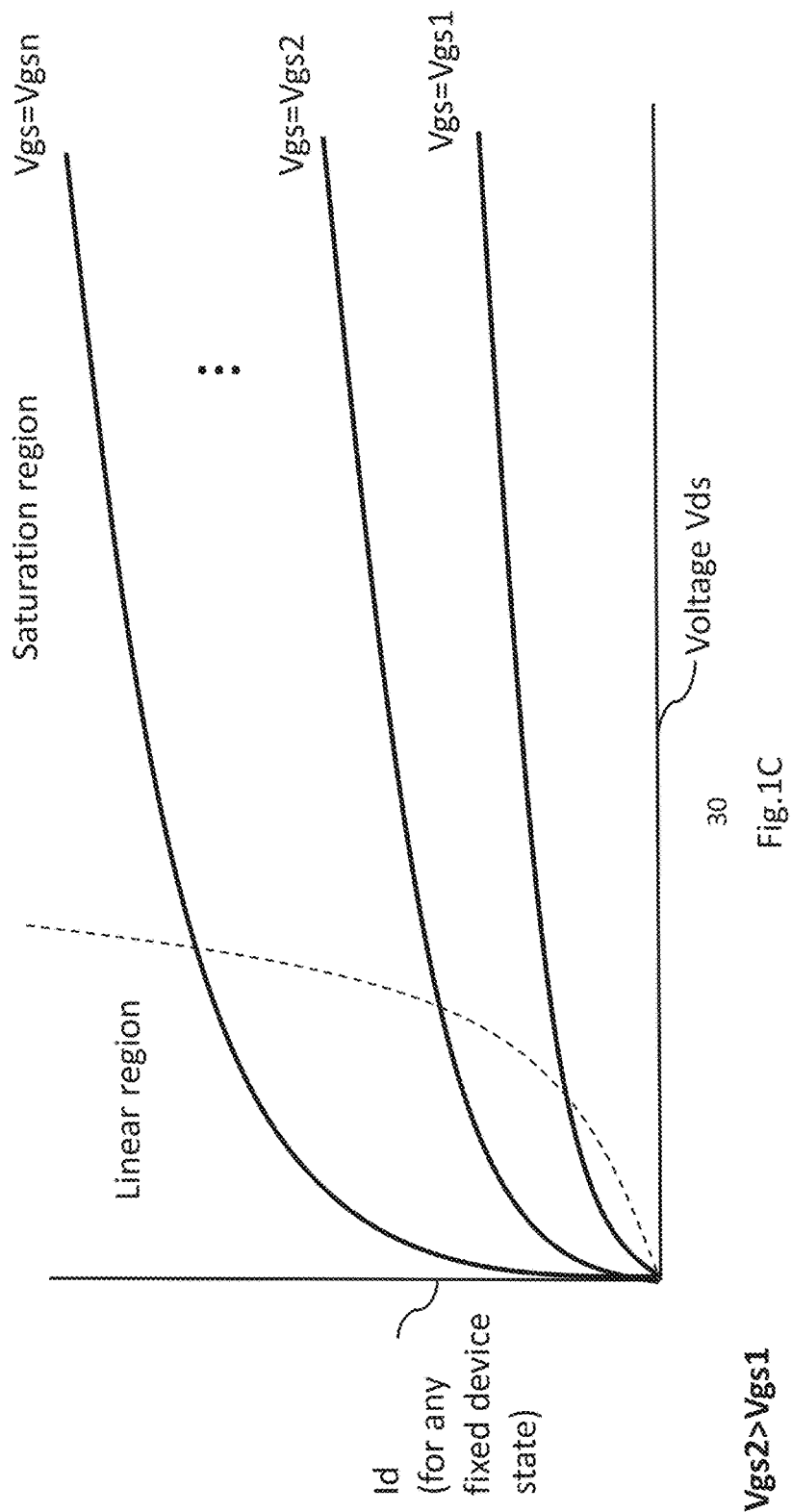

VECTOR-BY-MATRIX MULTIPLIER MODULES BASED ON NON-VOLATILE 2D AND 3D MEMORY ARRAYS

RELATED APPLICATION INFORMATION

This patent claims priority from provisional patent application 62/616,365, filed Jan. 11, 2017, titled VECTOR-BY-MATRIX MULTIPLIER MODULES BASED ON NON-VOLATILE 2D AND 3D MEMORY ARRAYS.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to a vector-by-matrix multiplier (VMM) modules and architectures such as for performing VMM operations using a two- or three-dimensional matrix or array of nonvolatile memory devices that perform fast and efficient signal processing such as for neuromorphic computing.

Description of the Related Art

Various types of memory arrays have been designed using nonvolatile memory transistors that can hold a memory or data value over time without being refreshed or after being powered off. However, these types of memory devices have been limited in their application with respect to vector-by-matrix multiplier (VMM) modules.

DESCRIPTION OF THE DRAWINGS

FIG. 1C is a plot of the drain-source channel current of the fixed-state floating gate transistor of FIG. 1A based on drain-source voltage showing the linear and saturation regions.

Figure 1A:
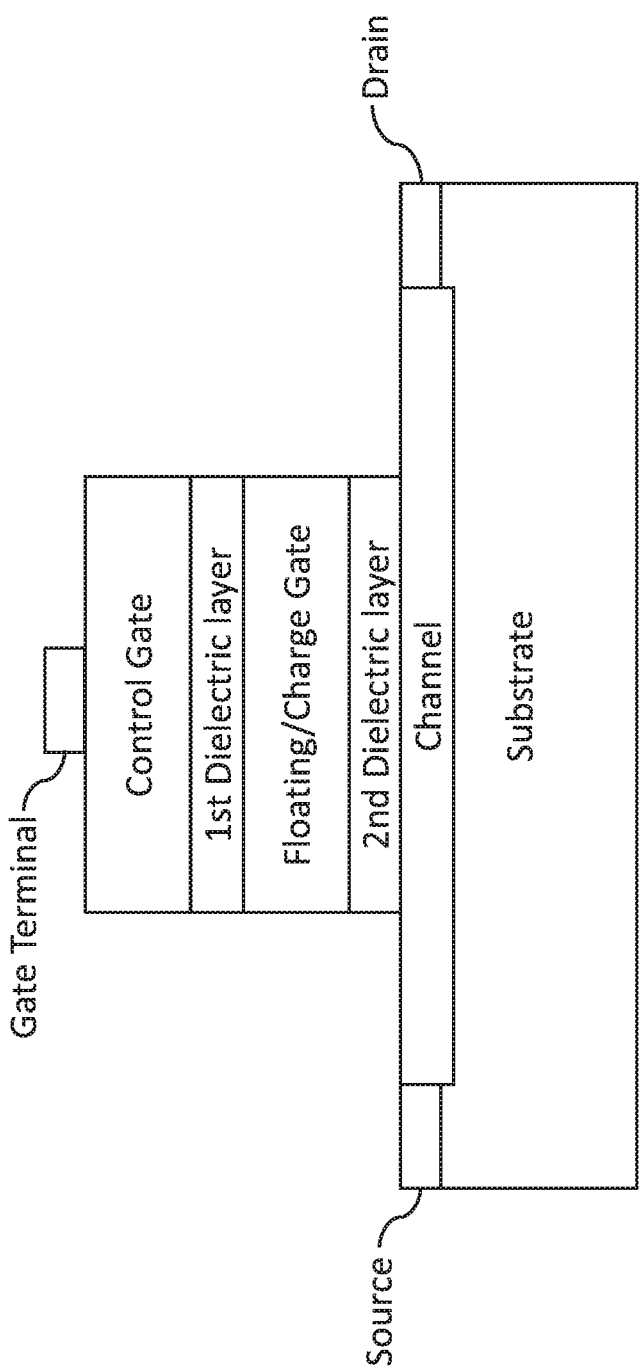
FIG. 1A is a side cross sectional schematic view of a typical floating gate transistor for use in vector-by-matrix multiplication (VMM).

Throughout this description, elements appearing in figures are assigned two-four-digit reference designators, where the most significant digit(s) is the figure number and the two least significant digits are specific to the element. An element that is not described in conjunction with a figure may be presumed to have the same characteristics and function as a previously-described element having a reference designator with the same least significant digits.

DETAILED DESCRIPTION

Technologies described herein provide modules, devices, systems and methods for performing vector-by-matrix multiplication (e.g., performing VMM) using a multidimensional (e.g., two or three dimensional) matrix or array of nonvolatile memory devices that perform fast and efficient signal processing. The modules may be used for neuromorphic computing, which includes computing devices that mimic, to at least some extent, neuro-biological architectures present in the human nervous system. These nonvolatile memory devices can be transistors that can hold a weight or data value over time without being refreshed or after being powered off.

The technologies herein include memory arrays that are modified to be efficiently programmed as and operate as analog vector-by-matrix multipliers (VMMs). One such application of the VMM is to implement neural networks (NN). Since most neural networks can be implemented with VMM modules, the same architectures (e.g., configurations, matrixes or arrays) of VMM modules described herein can be used for the implementation of neural networks.

For example, a 2D VMM may output vectors for neural paths that are weighted combinations of sets of input signals along rows or columns of a two-dimensional (2D) grid of wires or lines having nonvolatile memory devices forming synapses at each intersection. In some cases, each memory device outputs a signal that is a multiplication of its pre-programmed neural weight and an input signal. The same set of input signals can be applied across each neural path. Descriptions herein provide 3D VMM modules that include neural paths for more than one VMM (e.g., for more than one 2D VMM.)

A VMM module can be an electrical configuration of components (e.g., memory devices, transistors, operational amplifiers, resistors, subtractors and/or other circuitry) including the electrical connections between the components. In some cases, the VMM module may be or include a physical memory array that is formed or disposed on a chip as identified for or as a matrix or module herein. In some cases, the memory array is the physical configuration including the locations of the components and connections of the VMM components in hardware such as in silicon or on an integrated circuit (IC) chip.

The nonvolatile memory devices can be any of various types of non-volatile storage or computer memory that can retrieve stored information even after having been power cycled. They do not need constant power in order to retain data. Examples of non-volatile memory include resistive read only memory (RAM), silicon-oxide-nitride-oxide-silicon memory (SONOS), flash memory, ferroelectric RAM, most types of magnetic computer storage devices (e.g. hard disk drives, solid state drives, floppy disks, and magnetic tape), optical discs, and early computer storage methods such as paper tape and punched cards. In some cases, they are all the same type of device. In other cases, one or more of them may be different devices. The nonvolatile memory devices may all be floating gate (FG) transistors.

In FIGS. 1-25, the symbol of floating-gate (FG) transistor is used to represent any type of floating gate (FG) transistor or SONOS and the lines and nodes are used to show the connections making the two-dimensional (2D) or three-dimensional (3D) matrix of the VMM module. For example, FIG. 1A is a side cross sectional schematic view of a floating gate transistor 10 with a single gate terminal, such as any one or all of the transistors of FIGS. 1-25 herein. Floating gate transistor 10 may be a metal-oxide-semiconductor (MOS) transistor having a channel terminating in drain and source contacts as shown. Depending on the architecture of the 2D or 3D matrix, one of the source, gate or drain contacts may function as a signal input to the floating gate transistor and the other of the source or drain contacts may function as a signal output. Each floating gate transistor has an isolated or floating gate, such as isolated between two layers of dielectric 1 and 2 as shown. Electrical charge (e.g., Q) may be deposited and stored on the floating gate, typically using a tunneling mechanism and/or as explained for FIGS. 13-25. Each floating gate transistor 10 may have one or several gates (not shown), or possibly at the same gate terminal as the word line (WL) or main gate shown (e.g., see gate terminal of FIG. 1A), through which the device is getting erased or programmed (with the help of other terminals). The operating region of a FG transistor (e.g. subthreshold, linear, or saturation) is determined based on the voltages applied to gate(s), drain and source of the device as well as the internal state (charge) of the transistor. In the linear region, the drain-source channel current of the device is approximately a linear function of the drain-source voltage. The gain of this linear relation between drain-source channel current and drain-source voltage can be changed and modulated by the stored charge Q on the floating gate of the transistor which will determine the conductance of the drain-source channel.

Figure 1B:
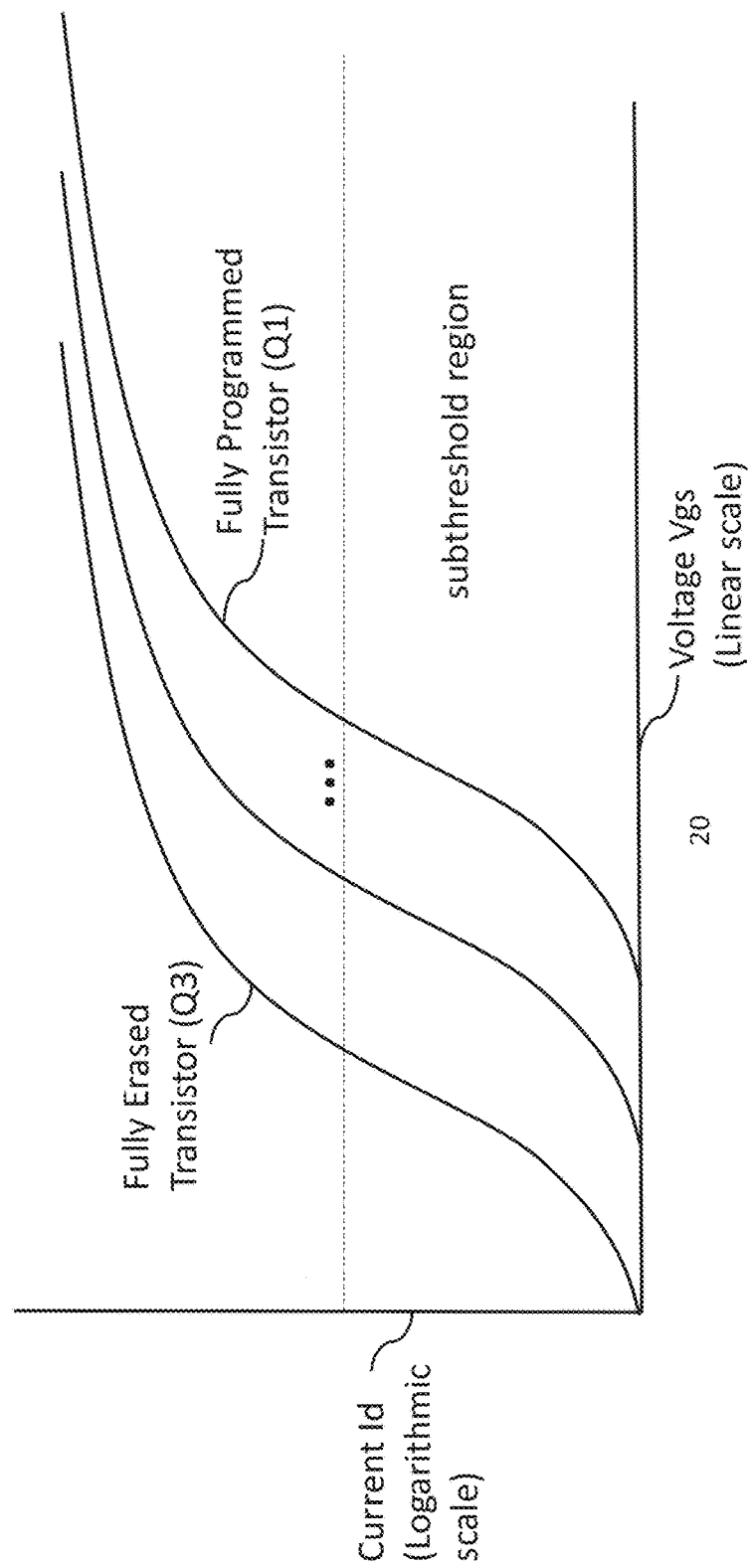
FIG. 1B is a logarithmic plot of the drain-source channel current of the floating gate transistor of FIG. 1A based on the gate-source voltage for different floating gate charges showing the subthreshold region in FG transistors.

For example, FIG. 1B is a logarithmic plot 20 of the drain-source channel current of a FG transistor when three different amount of charges are stored on its floating gate (e.g. Q1, Q2, and Q3) and a voltage is applied between its gate and source terminals. In this example, the device will be in subthreshold region when the drain-source current of a FG transistor is an exponential function of the gate-source voltage (linear in a logarithmic plot). When the device is more programmed (e.g. Q1), larger gate-source voltage needs to be applied to the transistor to activate it (to open the drain-source channel).

For example, FIG. 1C is a plot 30 of the drain-source channel current of a FG transistor based on the drain-source and gate-source voltages when a fixed charge is stored on a floating gate of the transistor (i.e. any of the Q1, Q2, or Q3 cases in FIG. 1B) demonstrating the linear and saturation regions in these devices. When the drain-source voltage is small, the relation between the drain-source current and drain-source voltage is almost linear (linear region of operation). By the increase of the drain-source voltage, the drain-source current becomes a non-linear function of the drain-source voltage (saturation region). For placing any FG transistors in any of these regions, the transistor needs to be activated by applying a large enough voltage to its gate (i.e. Vgs). In any of these regions, the amplitude of the output drain-source current will be proportional to the charge stored on the floating gate of the transistor. Thus, the transistor 10 of FIGS. 1A-C can be programmed by storing the charge Q in the floating gate of the FG devices and used (e.g., operated) as a weight storing unit and/or multiplier engine for VMM (e.g., weight for multiplication of a node of a matrix) or NN (e.g., weight of a neural network node) operations.

The concepts presented for FIGS. 1A-C are applied herein for FG devices having one gate or more than one gates. For example, transistor 10 may have a main gate terminal or the word line (WL), a second or third gate terminal (not shown in FIG. 1A) to modulate the charge transferred to floating gate during device erasure or programming. For example, if the FG devices have two or more gates, they can be configured in a same way as explained herein to create arrays capable of implementing VMMs.

The VMM modules using floating-gate (flash) transistors herein can then be used in different applications including signal processing, artificial intelligence (AI), machine learning, Neural networks (NN), etc. The symbol of FG transistor used in the FIGS. 1-25 (and optionally indicated with a "$T_{nm}$") represent floating-gate transistor in general and may be or include any multi-terminal FG transistors. During operation, the FG transistors are biased in read mode (e.g., are not being programmed) so there would be no change in the state of or charge stored in the FG transistors. Like other semiconductor transistors, the drain and source of the FG transistor might be used interchangeably.

Figure 2A:
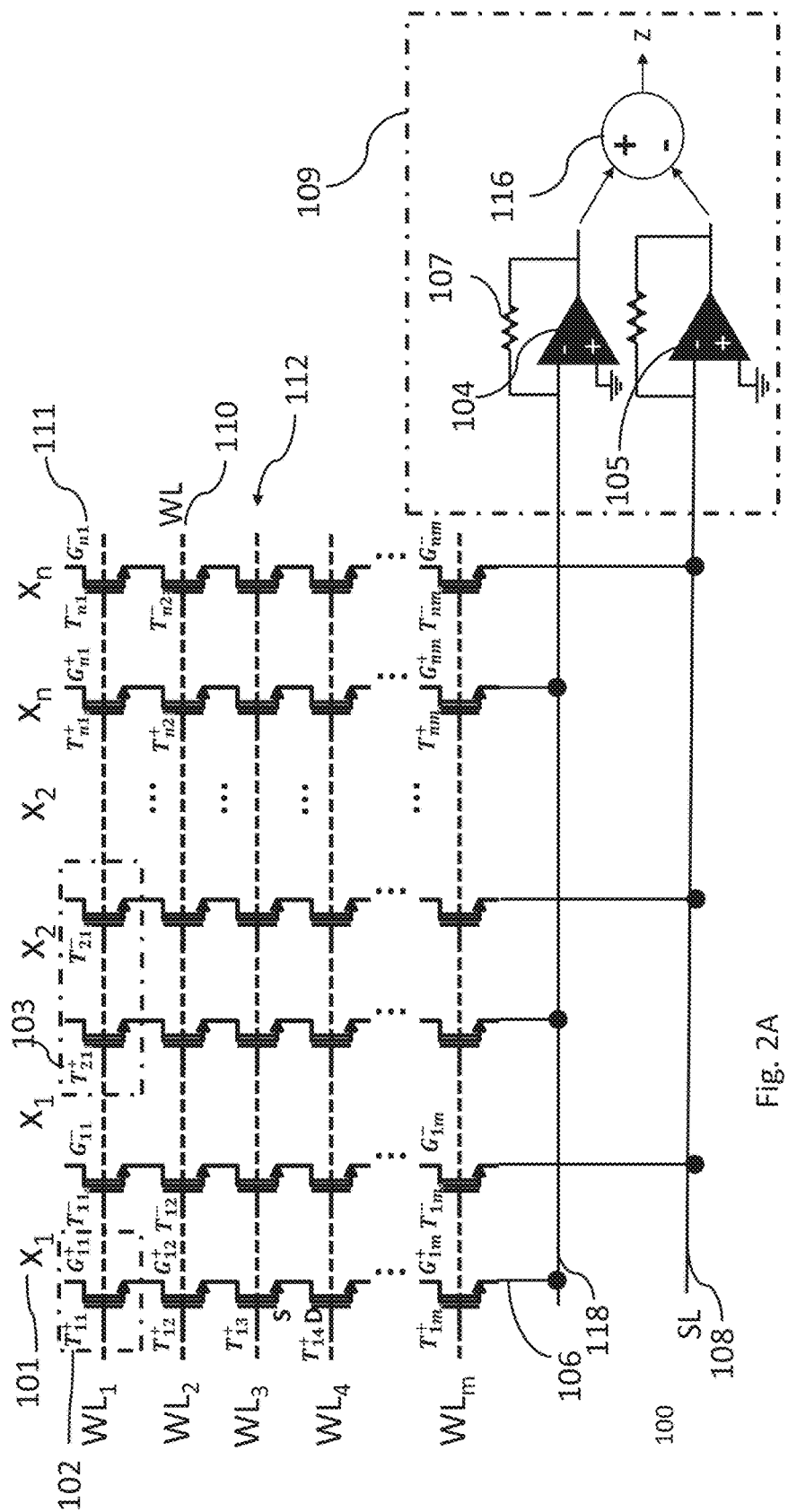
FIG. 2A is a module for VMM using sequential dot-product or vector-by-vector multiplier with two dimensional (2D) NAND routing.

FIG. 2A is a schematic diagram of a module 100 for VMM using sequential dot-product with 2D NAND routing. FIG. 2A shows a 2D NAND memory matrix or array 112 of m rows and n columns of transistors $T_{11}$-$T_{nm}$ that can be used for performing a VMM operation sequentially, one row at a time.

In the array 112, transistors located on the same row (e.g., same m) are sharing the same word line (WL) which is connected to the control gates of the transistors in that row. For example, transistors $T_{12}$-$T_{n2}$ are located on the same row and sharing the same WL 110. Transistors located on the same column (e.g., same n) are serially connected to each other so that the source of one transistor is connected to the drain of the next transistor. For example, the source S of $T_{13}$ is connected to the drain D of $T_{14}$. Each column n of transistors can be addressed or accessed just through the top and bottom connections of that column. Devices on each row or column may be marked as a positive $T^+$ and negative $T^-$ transistor so that positive and negative weights can be stored in the array using just sinking or sourcing FG transistors (e.g., using the subtractor in the neuron circuitry).

Analog charge values $Q_{11}$-$Q_{nm}$ are stored on the floating gate of each FG transistor putting the state of the device into a specific intermediate state ($G_{ij}^\pm$). For instance, state G may be the conductance of the transistor (which is affected by the charge Q) but is not the same as charge. For example, transistor 102 ($T^+_{11}$) has charge $Q^+_{11}$ putting it into state $G^+_{11}$. Analog programming of the FG transistors may be performed similar to digital programming of them, except that instead of using a single big erasure or programming pulse to program each transistor, several smaller pulses (e.g., a plus having length of between 1-1000 microseconds) are applied and the state of a transistor is measured at particular read condition after each pulse to assure correct programming.

The transistors may be programmed to have weights or stored charges Q of a selected value after training of the VMM such as after training of a NN that includes the VMM.

The analog programmed states of devices located on each row (e.g., row 2 with WL 110) can be read from the top (e.g., from drains of the top row 111) or bottom access points (e.g., from sources of the bottom row 106) by applying a read voltage to the selected WL (i.e., WL 110), applying a large enough voltage to other WLs of the other rows to cause them to be closed (e.g., short circuit from source to drain), and biasing either sources 106 or drains 111 (for example by applying voltage 101) while reading the currents from the other terminal. The large voltage applied to the word lines other than word line 110 causes the rest of the rows to be treated as pass transistors and they are closed by applying high voltage to their gates (assuming their channel resistance is low in this case and the dropped voltage is negligible). For example, the state of T12 can be read by applying a read voltage to WL 110), applying a large voltage to other WLs of the other rows, and biasing drains 111 by applying voltage to 101 while reading the currents from the other terminal at sources 106.

Since sinking and sourcing currents cannot be generated with a single FG transistor (e.g., transistor 102), a pair of FG transistors should be used (e.g., pair of transistors 103) in order to be able to create and store both positive and negative analog values. Positive and negative pairs ($T_{21}^+$ and $T_{21}^-$) can be in the same row or in the same column depending on how the neuron circuitry and the output subtractor is connected to the array. For example, module 100 uses two columns per each $X_i$ input signal and reads positive and negative portions of weights separately from these two columns.

For the application of VMM using module 100, rows m will be selected by applying a read voltage to the corresponding $WL_m$ and large voltage to the other rows, inputs of the VMM operation will be applied as voltage to $X_i$ s, and the result in the form of current which will be the dot product between the inputs $X_{1-n}$ and the weights (e.g., based on $G_{ij}^\pm$) stored in FG transistors will be measured from the metal line(s) connecting the bottom source line (SL) access points together (i.e., see SL 108). For this current measurement, different reading circuitry, neuron circuitry, current-to-voltage converter, analog to digital converter, etc. can be used. For example, module 100 uses current measuring circuit 109 to convert the currents output on SLs 108 and 118 while keeping the bias voltage (same as the one used as a read condition during FG device programming) on the line(s) 108 and 118. In the figure, as an example, each current is converted to voltage by a converter using an operational amplifier (104 and 105, respectively) with a resistive feedback (e.g. resistor 107). The output voltages of the converters are subtracted from one another by subtractor 116 to generate the output which is also needed to create positive and negative weights in the array. It is considered that different or other neuron circuitry can be used to measure the output in place of circuit 109. For the matrix or array of module 100 with m rows, m readings (e.g., output measurement by sequentially biasing WLs) or steps can be used to perform a full VMM operation, because the dot-product results or outputs are measured row by row.

In some cases, the FG transistors T can be used in subthreshold (exponential synaptic transfer function), linear, or saturation region. In some cases, the weights stored in the FG devices can be analog or digital. In some cases, the inputs applied to the array as Xi can be analog or binary. For the case of binary input, during operation the biasing of each FG transistor is the same as the read condition used when programming FG devices.

Figure 2B:
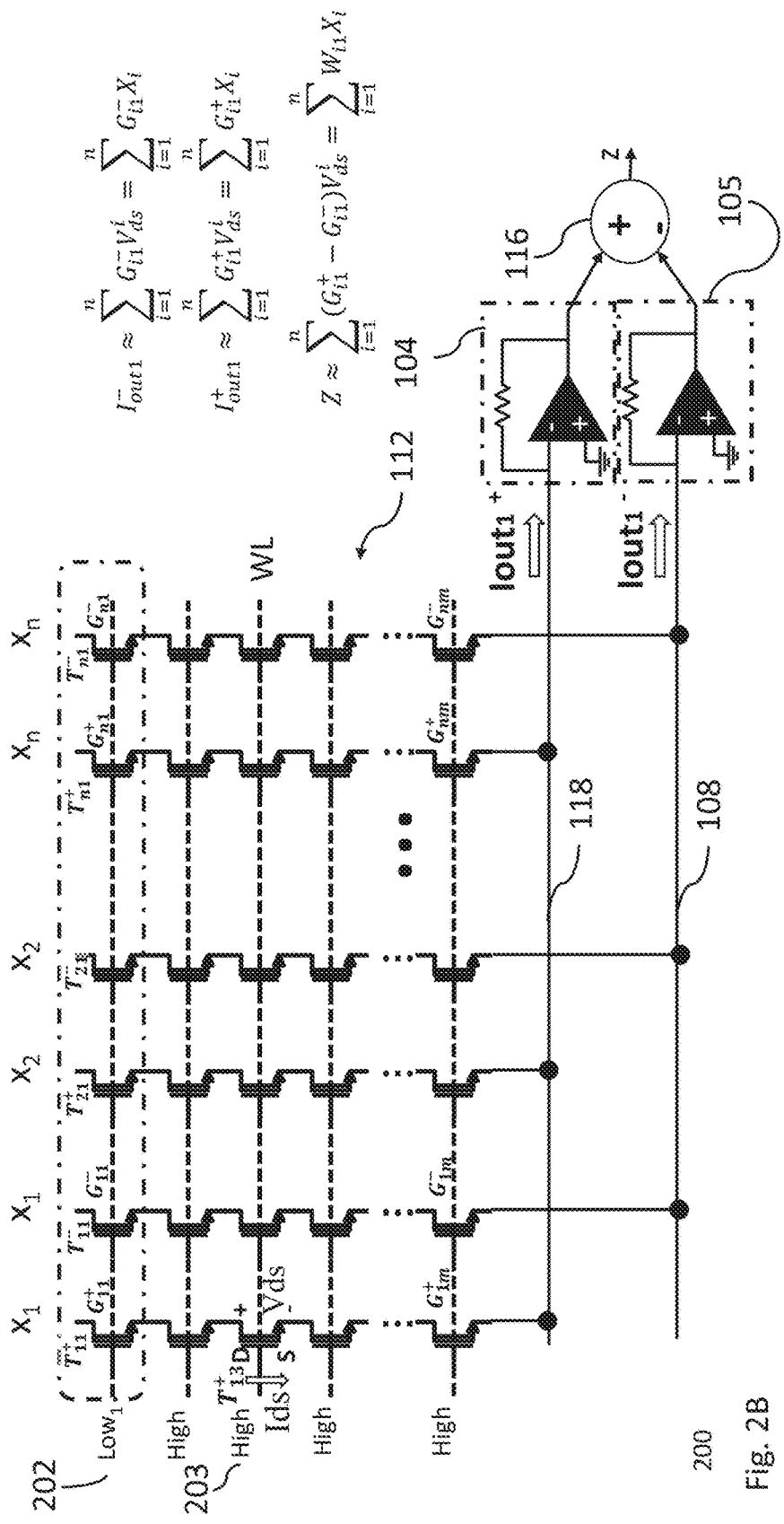
FIG. 2B is an example of an operation phase of the module of FIG. 2A for VMM.

FIG. 2B is an example of an operation phase 200 of the module 100 of FIG. 2A performing VMM. During operation, dot-product results will be measured one row at a time by applying low voltages to the selected row (e.g., see WL 202 of row 1) and high voltages to unselected rows or WLs (e.g., see WLs 203 for rows 2-m). The measurement of each row can be performed once per cycle of a clock being applied to module 200, and therefore completing the VMM outputs of module 200 in m clock cycles. For the selected row, the module 200 will execute the dot product between the inputs applied from the top $X_{1-n}$ to each transistor T and the weights G stored in the floating-gate transistors of that particular row. Read or operation voltage (e.g., a low voltage) is applied to the gates of transistors in a selected row that is doing VMM/dot-product (this voltage is used during programming weights) while inputs $X_{1-n}$ are applied to bitlines. These voltages are designed to put each transistor T in a linear region so there will be a linear relationship between the Vds (i.e. Inputs) and Ids of that transistor (e.g., see the transistor at WL 203).

Columns storing negative weights are serially connected together at the bottom by line 108, and the same is true for columns storing positive weights at line 118. The currents on these shared horizontal lines are subtracted to have both positive and negative weights in the array. If only positive or negative weights are desired, one of the sets of columns; one of the line lines 118 or 108; one of the operational amplifiers 105 or 104; and subtractor 116 can be excluded from module 100 or 200.

If the inputs are binary or if the FG devices (e.g., transistors T) are used in linear operation region, the current of each device can be approximated by its conductance (at a read condition) multiplied by the input applied as a voltage or $G_{ij} X_i$. These currents are added at the bottom lines 108 and 118 resulting in the dot products (i.e. $I_{out1}^-$ or $I_{out1}^+$). More specifically, the outputs during operation 200 will be:

$$I_{out1}^- \approx \Sigma_{i=1}^n G_{i1}^- V_{ds}^i = \Sigma_{i=1}^n G_{i1}^- X_i$$

$$I_{out1}^+ \approx \Sigma_{i=1}^n G_{i1}^+ V_{ds}^i = \Sigma_{i=1}^n G_{i1}^+ X_i$$

$$Z \approx \Sigma_{i=1}^n (G_{i1}^+ - G_{i1}^-) V_{ds}^i = \Sigma_{i=1}^n W_{i1} X_i$$

The example in FIG. 2 shows a segment in time where module 100 is calculating the dot product between the inputs and the weights stored in row 1 columns 1-*m* by applying a low read voltage to row 1 (e.g., a read voltage or operation voltage) and to the control gates of each transistor $T_{11-n}$; while treating the unselected rows 2-*m* as pass transistors by applying high voltage to their gates to closes them. Applying the read or operation voltage to the gates of transistors in row 1 (this voltage may be used during programming weights), while inputs $X_{1-n}$ are applied to them as their drain-source voltage and their sources are shorted and biased through lines 108 and 118, causes that row to perform the dot-product between the inputs and weights stored in that row.

Next rows can be computed similarly; and the whole VMM will be calculated in m clock cycles. An advantage of module 100 is that the neuron circuitry (i.e. output circuitry 109) and possible activation function circuitry can be shared between the rows (1 neuron circuitry per every array). A neuron circuitry may be a combination of operational amplifiers, feedback elements, subtractor, activation function that gathers the input signal or currents and do a meaningful post-processing on the signal such as converting the current to voltage or applying a nonlinear activation function without altering the computation performed in the memory array. The neuron circuitry may also be responsible for biasing the wires connecting the memory array to neuron circuitry.

Figure 3:
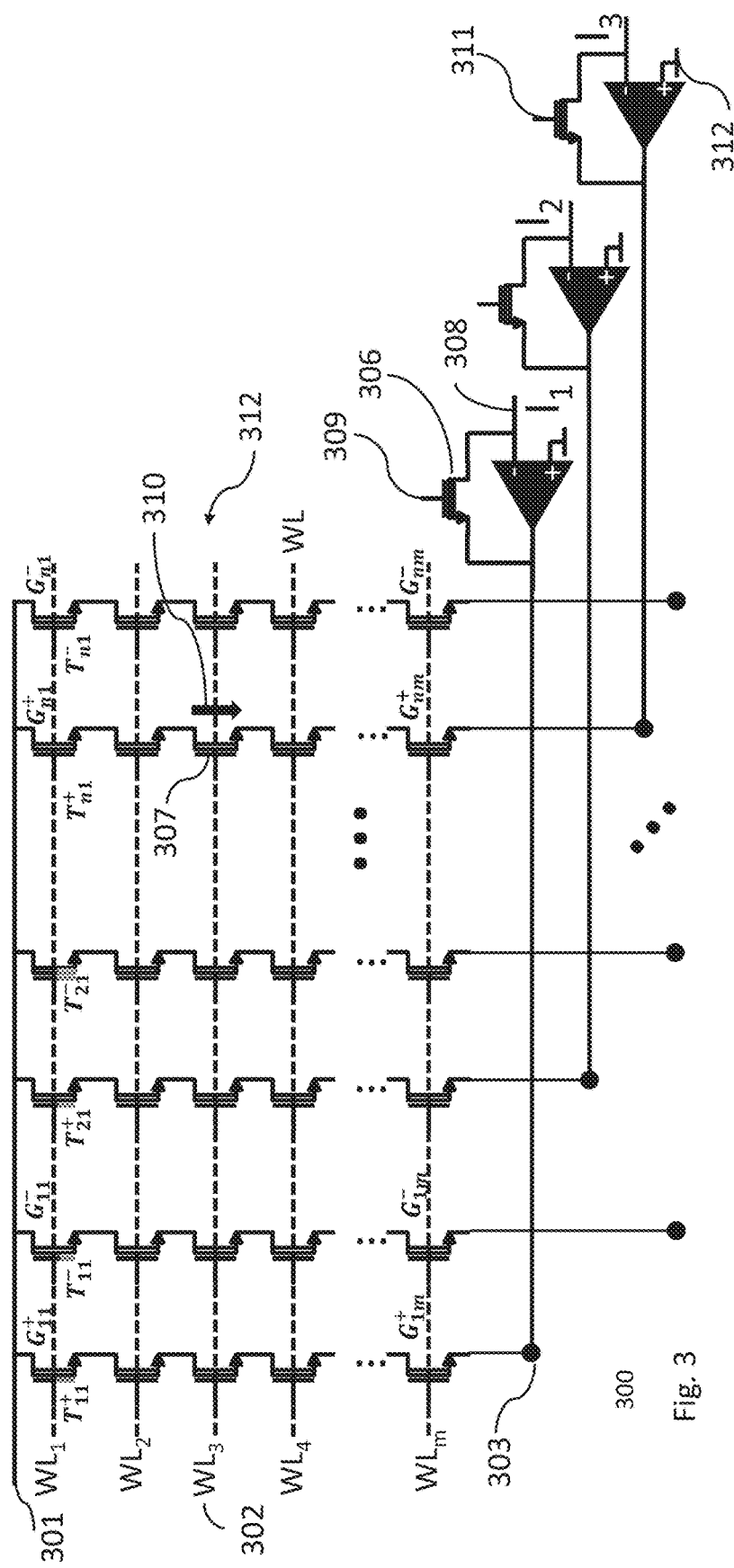
FIG. 3 is a module for VMM using sequential dot-product with 2D NAND routing, source-coupled.

FIG. 3 is a schematic diagram of a module 300 for VMM using sequential dot-product with 2D NAND routing, where the inputs are applied to the array using the source-coupled configuration. Module 300 includes a 2D NAND memory matrix or array 312 of m rows and n columns of transistors $T_{11}$-$T_{nm}$ that can be used for performing a VMM operation sequentially, i.e. one row at a time. FIG. 3 shows how the architecture of FIGS. 1-2 can be used in a source-coupled structure (e.g., shared SLs of the memory array are biased with voltages proportional to input current signals $I_1$-$I_m$) to implement a VMM operation. This architecture performs analog-input-analog-output sequential VMM multiplication.

Analog inputs are applied to operational amplifier inputs (e.g., see input 308) in the form of currents I1, I2 and I3, and the feedback transistors (e.g., see transistor 306 which can represent either a FG transistor or a regular FET transistor) convert (logarithmically or in a nonlinear way) these input currents into voltage (e.g., a voltage on line 303). These voltages are shared with the devices on the selected row of the array through lines connected to each columns bottom (e.g., see line 303). The positive terminal of operational amplifiers is also properly biased (e.g., line 312).

Here, the VMM is implemented again, row by row. Row 302 is selected by applying the small fixed voltage to its WL while the same voltage is also applied to the gates of the feedback transistors (e.g. voltage 309). Large voltage is applied to the other rows of the array to fully close these switches (e.g., 1-2 and 4-*m*).

FG transistors on the selected row will see the voltage on 303 on their source terminal. In this case, the current of these FG devices (e.g., current 310) will be equal to the input current (I3) multiplied by a gain proportional to the states of the FG transistor (e.g., charge or weight stored in the transistor 307's floating gate) on the selected row and the FG feedback transistor (i.e., transistor 311).

Similar to previous architectures, FG transistors in the array are programmed with analog weights. Weights can be represented by two FG transistors per node or neuron; one for positive and one for negative weight. For better accuracy, voltages on lines 312 and 301 can be set to the same voltage.

FG transistors $T_{11}$-$T_{nm}$ inside the array of module 300 can be programmed to have weights $G_{11}$-$G_{nm}$ with respect to the feedback FG transistors (i.e., transistor 306 and/or 311). For example, to store the weight w in 307, module 300 can be programmed in such a way that in operation mode, the current 310 be w times (e.g., higher than) the current I3. In other words, it will be the dot product of the charge or weight stored in the transistor 307's floating gate and the current I3.

Similar to module 100, here the measurement of each output can be performed once per cycle of a clock being applied to module 300, such as by completing the outputs of module 300 in m clock cycles. In other cases, they can be performed in according to another trigger event, and completed in m cycles of the other trigger event. The electrical configuration of transistors $T_{11}$-$T_{nm}$ of module 100 and/or 300 including the electrical connections between them may be described as a multidimensional or two-dimensional (2D) memory matrix of nonvolatile memory devices that performs the operations of a VMM. It is also considered that a three-dimensional (3D) memory matrix of nonvolatile memory devices may be used to create the operations of more than one VMM.

Figure 4:
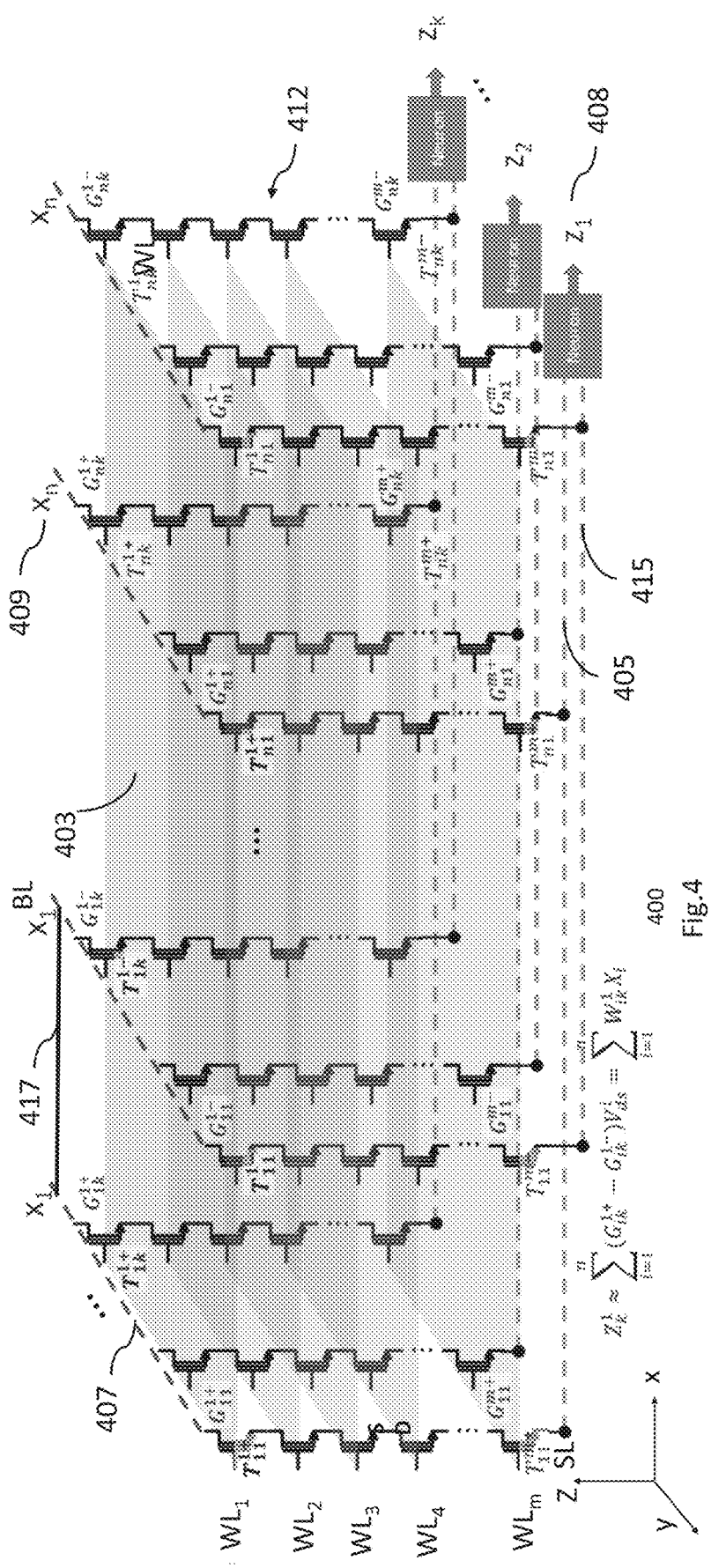
FIG. 4 is a module for multiple VMM using sequential VMM with three dimensional (3D) NAND routing.

FIG. 4 is a schematic diagram of a module 400 for implementing multiple sequentially executable VMMs with three dimensional (3D) NAND memory architecture. This figure shows how a 3D NAND architecture (e.g., configuration, matrix or array) of module 400 can be used for performing VMM multiplication operations of more than one VMM, such as for m VMMs.

FIG. 4 shows a 3D NAND memory matrix or array 412 of transistors $T_{11}^+$ through $T_{nk}^{m-}$ arranged in m horizontal layers each having a row of length n in a first dimension (e.g., left to right) and a row of length k in a second dimension (e.g., into the page). The m layers extend vertically along n columns. The terms horizontal and vertical refer to the 3D matrix as shown in the figure and do not imply any absolute orientation. The transistors of matrix 412 can be used for performing VMM sequentially, one layer at a time. Each of these transistors may be a FG transistor as described for module 100. It can be appreciated that the structure and/or locations of the transistors can be altered in the vertical and/or horizontal directions as long as the electrical (e.g., signal) connections shown are maintained. The electrical configuration of the transistors of matrix 412 including the electrical connections between them may be described as a multidimensional or three-dimensional (3D) memory matrix of nonvolatile memory devices.

In this 3D NAND architecture, the FG transistors are stacked layer by layer on top of each other creating the 3D array. All FG devices on a same layer (e.g., same m) are sharing the same gate plane and have all their WLs connected together, which is to say the control gates of all of the FG transistors in each plane are connected together. For example, transistors $T_{11}$-$T_{nk}$ located on the same first layer 403 are sharing the same WL.

In the z direction, devices on different layers 1-$m$ are connected together serially, meaning that the source S of the device in layer L is connected to the drain D of the device in layer L+1. For example, the source S of $T_{11}^{3+}$ is shown connected to the drain D of $T_{nk}^{4+}$.

Module 400 or matrix 412 might have some selector layers at top or bottom of them which are used for array programming of the weights or charges in the transistors. The programming of the devices in the array may be similar to the way the digital memory arrays are programmed. It may include descriptions for programming module 100 or 300.

For the first layer 1 (e.g., see 403), drains of the devices located along a second dimension (e.g., 1-$k$) at the tops of the columns are connected together, such as to receive the same input signal (e.g., see line 407). For the last layer m, sources of the devices located along a first dimension (e.g., 1-$n$) of the rows are connected together, such as to output to the same output signal (e.g., see line 405). Lines connecting the drains of the top layer transistors (e.g., see line 407) are perpendicular to the lines connecting the sources of the bottom layer transistors (e.g., see line 405) but their direction can be exchanged. Similar to regular memory arrays, source and drain terminals in this memory array can be exchanged.

Inputs (i.e. $X_i$s, 409) of this VMM architecture are applied to the top lines connecting drains together (e.g., see line 407) in a form of binary or analog voltages. Bottom shared source lines (e.g., see line 405) are connected to current to voltage conversion circuitry (as shown in FIG. 1) or to neuron circuitry (e.g., see "Neuron" blocks of FIG. 4) outputting signals Z1-Zk) which is forcing a virtual voltage to each of these lines through which the FG devices inside the array are biased. Any neuron circuitry can be used here for any intended functionality. VMM output results will be equal to the current on bottom layer source lines (e.g., see line 405). The output results may be the subtraction of currents on adjacent lines (e.g., subtraction of line 415 from line 405) to create the differential architecture required for negative weights. The outputs of the whole module including the functions applied by neuron circuitries will be $Z_i$s. For example, output 408 will be the subtraction of line 415 from line 405.

As compared to 2D structures, module 400 and/or matrix 412 is able to perform faster and more efficient vector by matrix multiplier, using much denser architecture such as for neuromorphic computing. For example, they are able to implement m k×n VMMs using a single 3D array where these VMMs can be used one at a time. Due to the symmetric architecture of 412, $G_{nk}^{m+}$ and $G_{nk}^{m-}$ can be implemented either in the x-direction or y direction. Based on how the positive and negative portions are weight are stored in the array (i.e. along x or y direction), different bottom SLs 405 or 415 should be connected to the neuron circuitry for the current subtraction.

Every layer of this 3D memory array 412 can implement one distinct VMM operation per cycle. That is, one of layers 1-$m$ can be activated with a WL and inputs Xi can be input to the layer to obtain the outputs for a distinct VMM in a non-sequential process. The next cycle can be used to determine the outputs for a different VMM. This provides a quicker and more efficient structure because in all of these VMM operations, the input terminals and input circuitries (e.g., see $X_{1-n}$), and output neurons or output circuitries (e.g., see $Z_{1-k}$) are shared between layers. Therefore, one VMM out of the all implemented VMMs can be selected for operation or used at a time. Any particular VMM will be selected by applying a small read voltage to the WL plane of that layer while the rest of the layers are deselected by applying a large voltage to their WL plane. Each time this is done, the functionality of the circuit will perform the operation for the whole VMM in one layer.

For example, when binary or analog inputs are applied to input lines 407s through 409s as voltages, Each FG in the selected layer produces a current proportional to the product of the applied input (drain-source voltage) and the weight stored in it (when the FG transistors are biased in linear region), the generated currents will be added up automatically on the SLs (e.g., see line 405) which is the results of VMM operation. For having both positive and negative weights, current of adjacent lines (e.g., see lines 405 and 415) can be subtracted from one another to create differential weights (e.g., see $Z_1$-$Z_k$).

During operation, the outputs will be:

$$Z_k^1 \approx \Sigma_{i=1}^n (G_{ik}^{1+} - G_{ik}^{1-}) V_{ds}^i = \Sigma_{i=1}^n W_{ik}^1 X_i$$

In some cases of matrix 412, the FG transistors T can be used in any of the subthreshold, linear or saturation region. For some cases, if the operation of one or more transistors T is nonlinear, software or programming circuitry for programming or training module 400 can correct for or create a linear output based on the weight and input as noted above. Linear operation can be achieved by using transistors in linear region or by applying input as binary numbers (or one bit at a time and post-processing outputs later).

Using module 400, m VMM operations each with a size of n×k can be performed in m steps or cycles. Thus, this circuit alone is enough to implement a fully connected network with m layers (each layer is a separate VMM which can be implemented by a row of a 3D NAND). In addition, it performs the operations using weights stored in the FG transistors T that can be either analog or even binary. It is considered that the effect of channel resistances can be decreased by differential programming of weights which can take into account the channel resistance during programming.

Also, the effect of channel resistance of flash transistors T acting as pass transistors and deselected by applying large voltage to their gate or WL plane can be compensated during training, such as by software or programming circuitry for programming or training module 400. Also, these channel resistances will be the same for the pair of transistors having G+ and G- and thus will be partially compensated for in the differential architecture of matrix 412.

Analog programming of these devices T may be similar to digital programming of the 2D NAND array, such as by instead of applying a long and large voltage pulse to completely turn the devices on or off, narrow and smaller pulses can be applied to modify the charge stored in these transistors, gradually until the desired state is reached (like programming MLC and TLC memories).

It is considered that the architecture of module 400 (and/or matrix 412) and the same in-memory computation concept explained here can be independent of the technology of the flash transistor type used for transistors T and can be implemented with different memory technologies like charge-trapping, SONOS, flash, floating-gate, built-in current sensor (BiCS), pipe-shaped BiCS, vertical NAND (V-NAND), etc.

Figure 5:
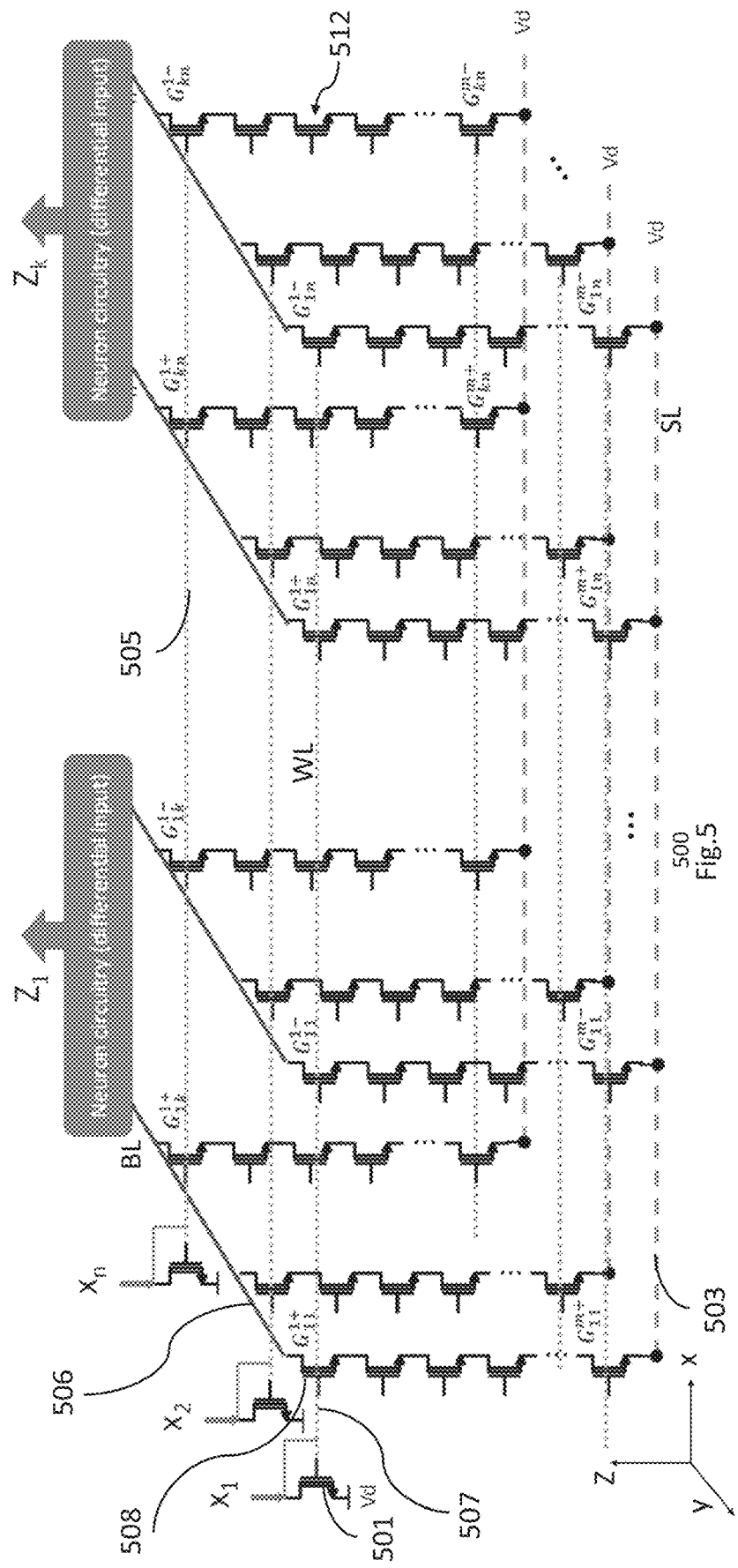
FIG. 5 is a module for multiple VMM using sequential VMM with 3D NAND routing and gate-coupled configuration.

FIG. 5 is a module 500 implementing multiple VMM modules sequentially accessible using 3D memory architecture. This figure shows how a 3D NAND like architecture of module 500 can be used for performing VMM operations of more than one VMM, such as for m VMMs.

FIG. 5 shows a 3D memory matrix or array 512 of transistors $T_{11}^{1+}$ through $T_{nk}^{m-}$ arranged similar to those of array 412. As compared to module 400, for each layer of module 500, there is not a plane connecting all WLs/gates together. Instead, WLs of the memory devices T of module 500 are connected with wires in the x direction only (e.g., from 1-n). Also, neuron circuitries are connected to the drains rather than source lines, such as at bit lines (BL) of each pair of positive are negative columns to provide outputs $Z_{1-k}$. For module 500, all of lines 503, 505, 506 can be rotated by 90 degrees and still provide the same matrix or configuration.

In this architecture (e.g., configuration), inputs $X_{1-n}$ are applied as currents to the diode connected external flash transistors (e.g., see transistor 501). These transistors convert the applied inputs to voltage and shared that voltages with the devices in the selected row (e.g., see row 507). FG devices in the selected layer convert this voltage back to current with a gain proportional to the states of the external FG transistor (i.e., see transistor 501) and the states of FGs in the selected layer (like layer 508). This current may be a dot product of the input signals X and the states G of the FG transistors in the selected layer. The generated currents are then automatically added up on the wires biased through neuron circuitry (e.g., see wire 506). Again, one VMM can be implemented and executed per each layer, one layer at a time. In some cases, various neuron circuitry can be used for the "Neuron circuitry" of $Z_{1-k}$.

An advantage of modules 400 and 500 is that the external FG transistors (e.g., see transistor 501) and output neuron circuitries can be shared between layers.

Also, the architecture of modules 400 and 500 can be used for implementing binary weight or binary representations of weights. For example, each set of eight FG transistors can represent one 8-bit weight by having them implementing the binary representation of the weight).

Figure 6:
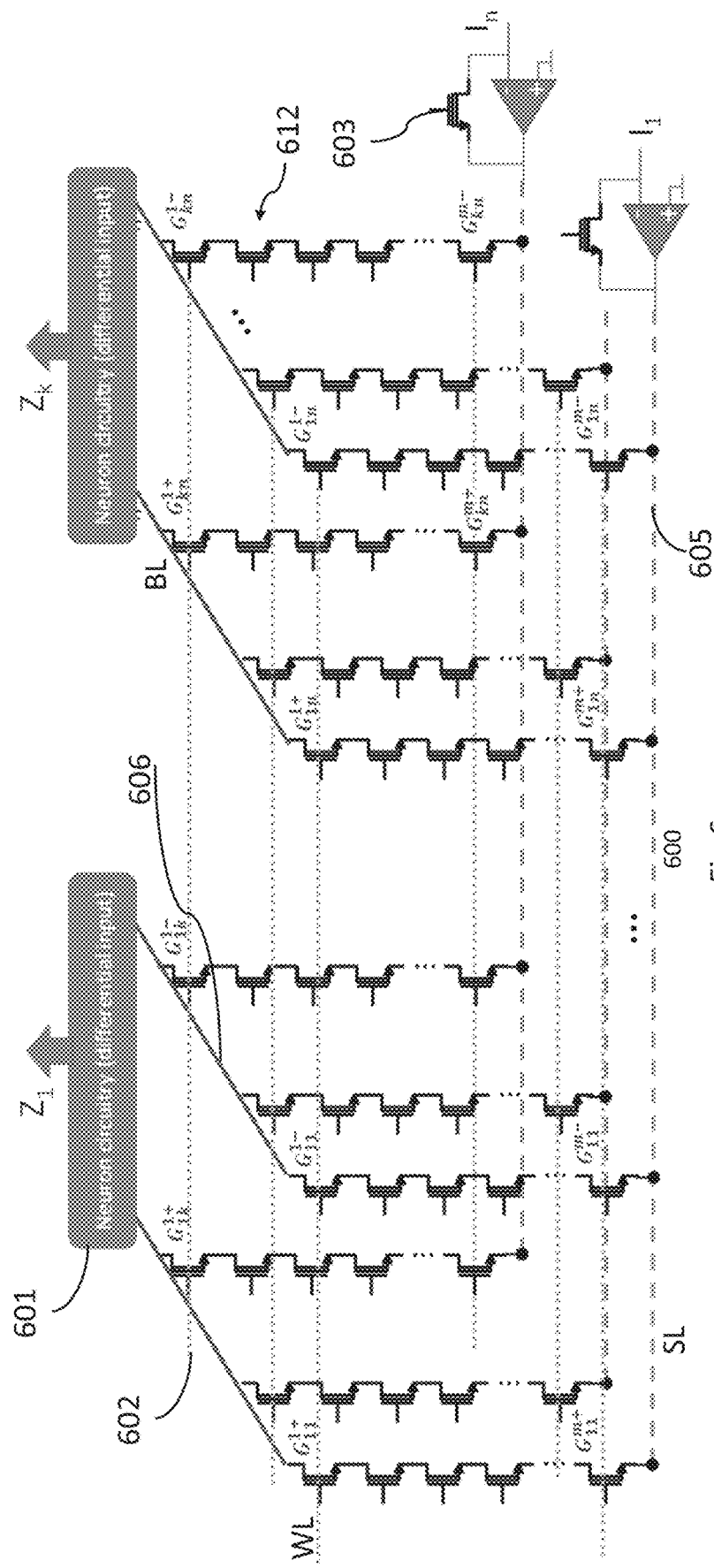
FIG. 6 is a module for multiple VMM using sequential VMM with 3D NAND routing, using source-coupled configuration

FIG. 6 is a module 600 for implementing VMM using 3D memory architecture of 500, where inputs are applied to the array using source-coupled configuration. FIG. 6 shows how the architecture of FIGS. 4-5 can be used in a source-coupled structure (e.g., shared accessible SLs of the memory array are biased with voltages proportional to input current signals $I_1$-$I_n$) to implement a VMM operation. This figure shows how a 3D memory architecture of module 600 can be used for performing VMM multiplication operations of more than one VMM, such as for m VMMs.

FIG. 6 shows a 3D memory matrix or array 612 of transistors arranged similar to those of array 512. As compared to module 500, module 600 uses a source-coupled configuration similar to that of module 300. For example, for module 600, the inputs are applied as current to I1 into the operational amplifiers. Feedback FG transistors convert the input current to voltage logarithmically on SL lines (e.g., see line 605). These voltages will be passed through the layers of the memory array deselected by applying large voltages to their WL and will be applied to the sources of the FG transistors on the selected layer which has a small voltage applied to its WL. The WL of FGs in the selected layer (e.g., see line 602) will be biased by the same small voltage which is applied to the gate of the FGs used as a feedback element of opamps (e.g., see gate of transistor 603). FG transistors in the selected layer convert the voltage bias between their source and gate back to current which will be then added up with other currents in the top wires connecting drains together (e.g., see line 606) and to neuron circuitry (e.g., see circuit 601). When worked in subthreshold, the conversion may be a dot product of the input current I and the weight G stored in each transistor T which is defined based on the state of FG feedback transistors. These wires (e.g., see line 606) are biased with operating voltage through or using the neuron circuitry. In some cases, lines 602, 605 and 606 can be rotated by 90 degrees.

In some embodiments, this architecture of module 600 includes the WLs of each horizontal layer of the FG transistors connected together through a plane (e.g., like module 400 of FIG. 4). A fixed voltage can be applied to the WLs of FGs in the selected layer to activate those FGs.

Figure 7:
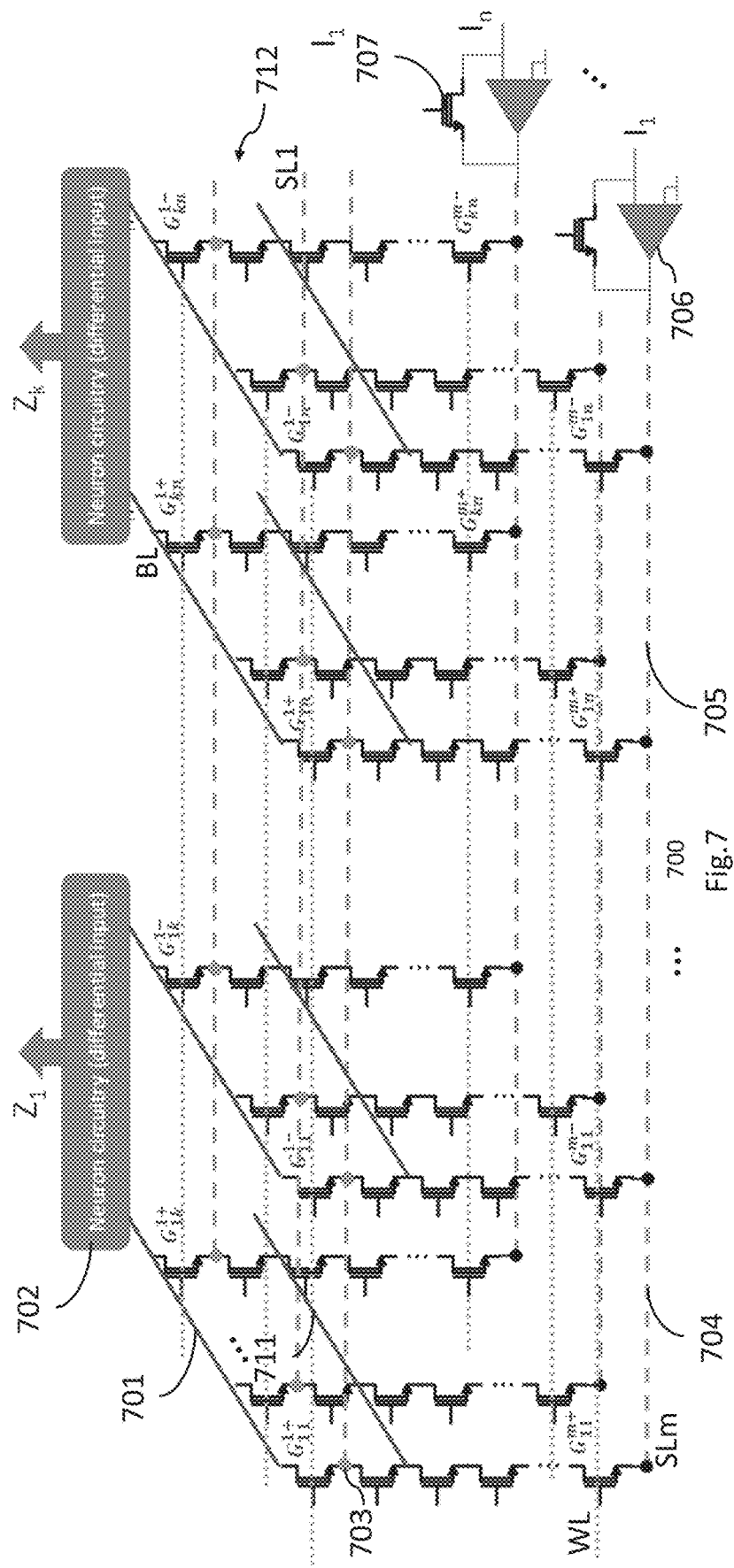
FIG. 7 is a module for multiple VMM using sequential VMM with 3D NAND routing, using source-coupled configuration.

FIG. 7 is a module 700 for implementing multiple VMM modules sequentially executable using 3D memory architecture, where the inputs are applied using the source-coupled configuration. This figure shows how a 3D memory architecture of module 700 can be used for performing VMM multiplication operations of more than one VMM, such as for m VMMs.

FIG. 7 shows a 3D memory matrix or array 712 of transistors arranged similar to those of array 512. As compared to module 500, module 700 uses a source-coupled configuration for applying VMM inputs and having each layer 1-m of the 3D architecture with its own input and its own output. For example, for module 700, the inputs are applied as currents I1-In to the operational amplifiers and the feedback FG transistors convert the input currents to voltage logarithmically on only the SL lines of a selected layer (e.g., see opamp 706) which can be switched to any of the SLs of a layer such as SL1 of layer 1 (e.g., see lines 703) or SLm of layer m (e.g., see line 704). These voltages will be passed to the SLs of the selected layer of the memory array without applying them to the SLs of the other transistors. In module 700 the WL of FGs in the selected layer will be biased by the same small voltage which is applied to the gate of the FGs used as a feedback element of opamps (e.g., see gate of transistor 707). However, it will not be necessary to perform deselection of other layers by applying large voltages to their WLs because the other layers are not part of the signal path through the selected layer. The transistors of the other layers are isolated and open circuits because they are not activated or biased.

FG transistors in the selected layer convert the voltage bias between their source and gate back to current which will be then added up with other currents in the top wires connecting only that layer's drains together (e.g., see line 701 for layer 1) and to neuron circuitry (e.g., see circuit 702). The conversion may be a dot product of the input current I and the weight G stored in each transistor T which is defined based on the state of FG feedback transistors. These wires (e.g., see line 701) are biased with operating voltage through or using the neuron circuitry. In some cases, SLs, WLs and bit lines (BL) (e.g., see line 701) can be rotated by 90 degrees.

In module 700, since each layer of the 3D architecture has its own input and its own output, when computations are performed in one layer (e.g., that layer is activated and operating), the effect of other serially connected FG transistors of the matrix 712 will not be seen or included at the output (e.g., see line 701) and there would be no need to apply large voltage to other WLs. Using module 700 also allows simultaneous computation in different layers of the matrix 712 (e.g., crossbar) if inputs and neuron circuitries are considered for every layer. That is, input circuitry like opamp 706 and transistor 707 can be applied to the SLs and WLs of each of layers 1-$m$ simultaneously; while output circuitry like lines 701 and circuitry 702 are applied to the BLs of each of layers 1-$m$ to read the outputs of all the layers at one time or in a single clock cycle.

Also, in module 700, since the FG transistors of matrix 712 are not serially connected along the columns during operation and since each layer can be operated separately to provide an output, the channel resistance of the transistors of the other transistors of other layers are not included in or seen in the output of a selected layer (e.g., at line 701). Again, here the multiplication for each transistor T or node can be performed in linear mode or in subthreshold using gate-coupled or source-coupled configurations.

Figure 8:
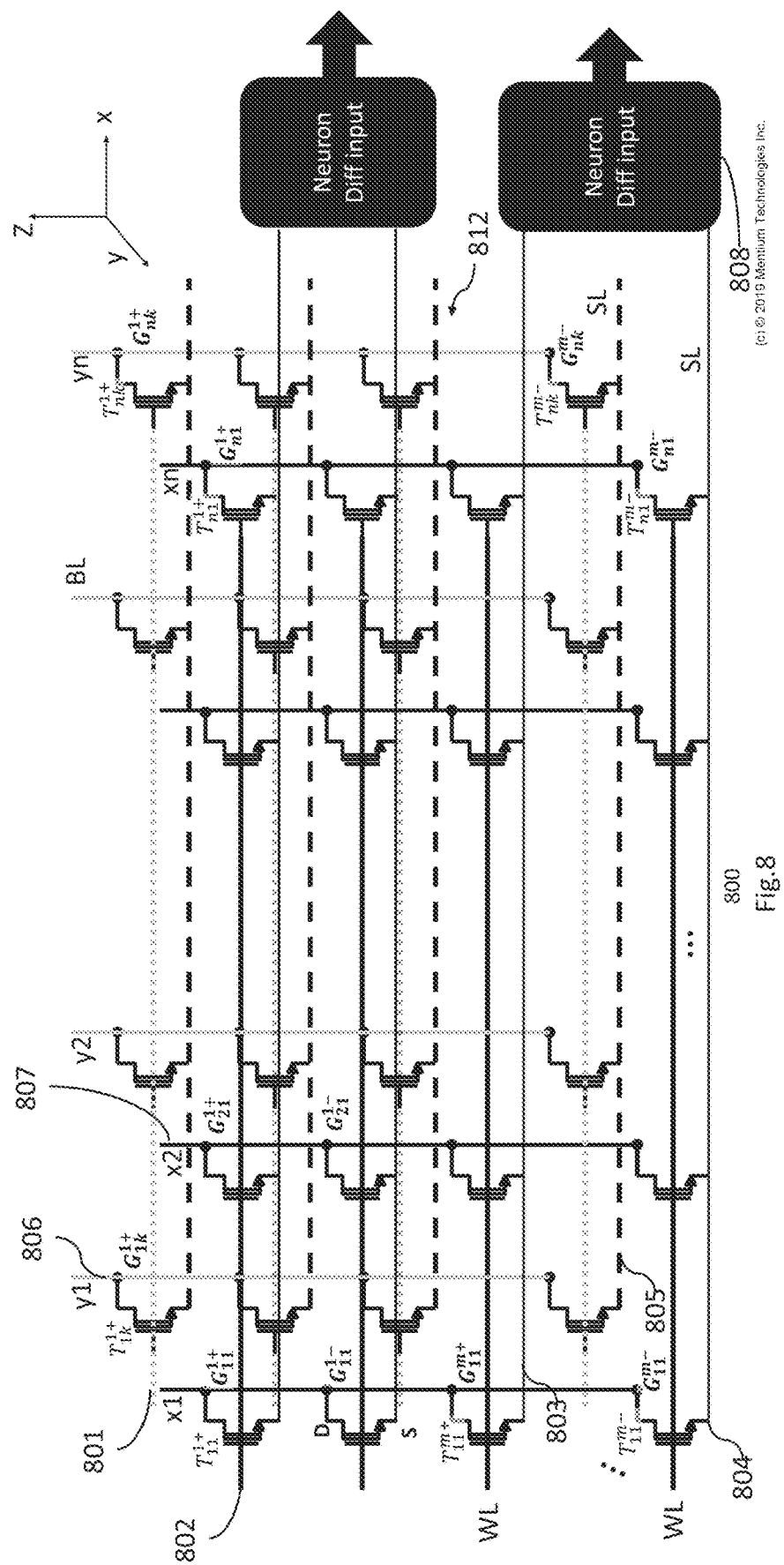
FIG. 8 is a module for multiple VMM using sequential VMM with 3D NOR routing.

FIG. 8 is a module 800 for implementing multiple sequentially executable VMM modules using 3D NOR-like memory architecture. FIG. 8 shows a 3D NOR-like memory matrix 812 or array of m layers, where each layer has an xk 2D array of FG memory devices. Devices located on each layer or on each cross section of the 3D array in the y direction can be used for the implementation of one VMM operation. Module 800 may implement VMMs that operate in linear mode. This figure shows how a 3D NOR architecture (e.g., configuration, matrix or array) module 800 can be used for performing VMM multiplication operations of more than one VMM, such as for m or k VMMs.

FIG. 8 shows a 3D NOR-like memory matrix or array 812 of transistors arranged in a 3D architecture for performing VMM operations. In this architecture bitlines (e.g., see BL and line 807) are connected vertically, source lines (e.g., see SL and lines 804, 805) are connected horizontally, and gate lines are connected horizontally (e.g., see WL and lines 801, 802). For example, transistors located on the same vertical (Z,X) slice or surface (e.g., same k) and are in the same layer can share the same word line (WL). For example, transistors $T_{11}^{1+}$ to $T_{n1}^{1\mp}$ are located on the same slice are sharing the same WL 802. Transistors located on the same column (e.g., same n; or are in the Z direction) have their drains connected to the same input or input signal. Transistors located on the same layer on the vertical (Z, X) slice or surface have their sources connected to the same output or output signal. Due to the symmetric structure of this architecture, the architecture will remain intact if these lines are rotated by 90 degrees.

If bipolar weights are needed, weights will be implemented differentially ($G_{ij}^{k+}$ and $G_{ij}^{k-}$) using two FG transistors of the matrix 812 while the output neurons (e.g., see neuron 808) are subtracting the currents of negative devices from the positive devices (e.g., subtract current of line 804 from that of line 803).

Inputs are applied to bitlines (x1, . . . ,xn to y1, . . . ,yn) like lines 806 and 807 while the outputs will be in the form of current which are measured on source lines (like lines 804 and 805). Neuron circuitry (e.g., neuron 808) can be any configuration and includes activation functions implemented in CMOS, such as either next to or underneath the array. Unlike 3D NAND (e.g., modules 300-700), since FG devices T of matrix 812 are not serially connected, the channel resistance of devices T is not seen at or does not exist in the output signals. Therefore, the module 800 outputs and the VMM operations of the module can be more accurate than that of a 3D NAND architecture.

During operation a fixed voltage can be applied to gates (like gates 801 and 802). Thus, these WLs or gates can also be fabricated (e.g., in an array) as horizontal planes shorting all WLs together in each layer. In some cases, they can be fabricated as vertical lines rather than horizontal lines/planes. In this case, devices can still each be individually addressed for programming through their different bitline BL and source line SL. Similarly, source lines SL can also be fabricated as horizontal planes connecting all SLs together in each layer, but since outputs are read from source lines, if the SLs get connected together, we have to perform operations for one VMM at the time to avoid combining the results of VMMs on the source lines as outputs.

The best accuracy of VMM might be achieved when devices T are used in their linear region (although not required) so the current output of each device will be the multiplication between its channel conductance G (e.g., based on its stored weight or charge Q) and the input voltage applied to its bit line BL or drain. These currents will be added up on the source lines SL connected to neuron circuitry (e.g., neuron 808). As noted above, various types of neuron circuitry can be connected to the source lines to measure outputs and the neuron circuitry can also include the activation function.

Each 2D cross-section (e.g., slice of (Z, X) plane) of this 3D array in the y direction can implement one 2D VMM. So, unlike some 3D NAND-like architectures, all VMMs implemented with this 3D architecture can be used at the same time (implementing k VMMs where k is the number of FG devices in the y direction.)

Stored weights in the GF devices T can be analog. In other cases, they can be digital as a special case of analog. Inputs applied to bitlines can also be analog. In other cases, they can be digital or binary.

Figure 9:
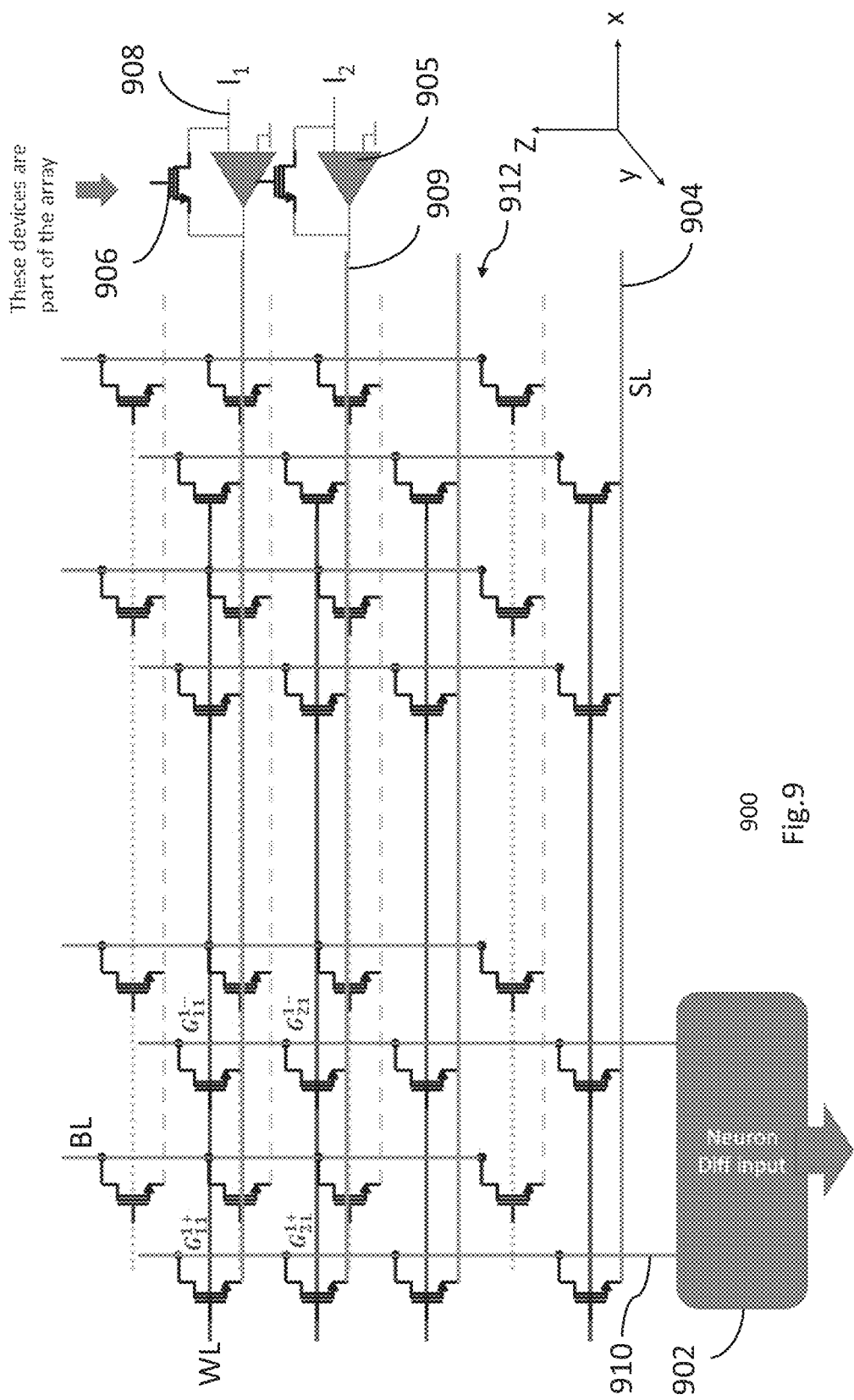
FIG. 9 is a module for multiple VMM using 3D NOR memory array biased in subthreshold, source-coupled.

FIG. 9 is a module 900 for implementing multiple VMM modules using a 3D NOR-like memory array biased in subthreshold, where the inputs are applied to the array using the source-coupled configuration. FIG. 9 shows how the 3D NOR memory matrix 912 or array of transistors similar to the matrix 812 in FIG. 8 can be used to implement VMM using a source-coupled configuration. For example, FIG. 9 shows how the architecture of FIG. 8 can be used in subthreshold using a source-coupled configuration with SLs of the rows of memory devices biased with voltages proportional to input signals $I_1$-$I_n$ to implement a VMM operation. This figure shows how a 3D NOR architecture of module 900 can be used for performing VMM multiplication operations of more than one VMM, such as for k VMMs.

In this architecture, analog inputs (e.g., current I1 input 908) are applied to the input circuitry consisting of an operational amplifier (e.g., opamp 905) with a feedback FG or regular transistor (e.g., FG transistor 906). This input circuitry converts the input current I to voltage logarithmically which will be applied to the source lines SL of the array (e.g., voltages at SL line 904 or 909). In some cases, the FG feedback transistor is considered part of the architecture or part of matrix 912.

FGs, T inside the array convert the voltage back to output current based on their internal state G (e.g., which is based on the weight or charge Q stored in the transistor) and these converted currents will be added up on the bit line (e.g., output signal line 910) which are connected to output neuron circuitry (e.g., neuron 902). The neuron circuitry is also responsible for biasing the bitlines BL of the transistors.

The voltage on the gate of the feedback element (e.g., see gate 906) is the same as the voltage applied to the WLs of the array during operation. Since the applied voltage to WLs is fixed during operation, WLs can be routed in the array with horizontal wires, vertical wires or even through metal planes; thus connecting all WLs on a same layer together with a plane. By having separate neuron and input circuitries, module 900 can implement k different VMM operations at the same time where k is the number of layers or (Z, X) slices of (FGs) in the y direction.

In some cases, the input circuitries can be shared between different VMM slices by shorting the source lines together (or implementing them with horizontal planes rather than metal wires). In this case, we would be able to implement one VMM at a time and the VMM will be selected by applying proper voltages or inputs to bitlines and/or WLs of one slice at a time.

Figure 10:
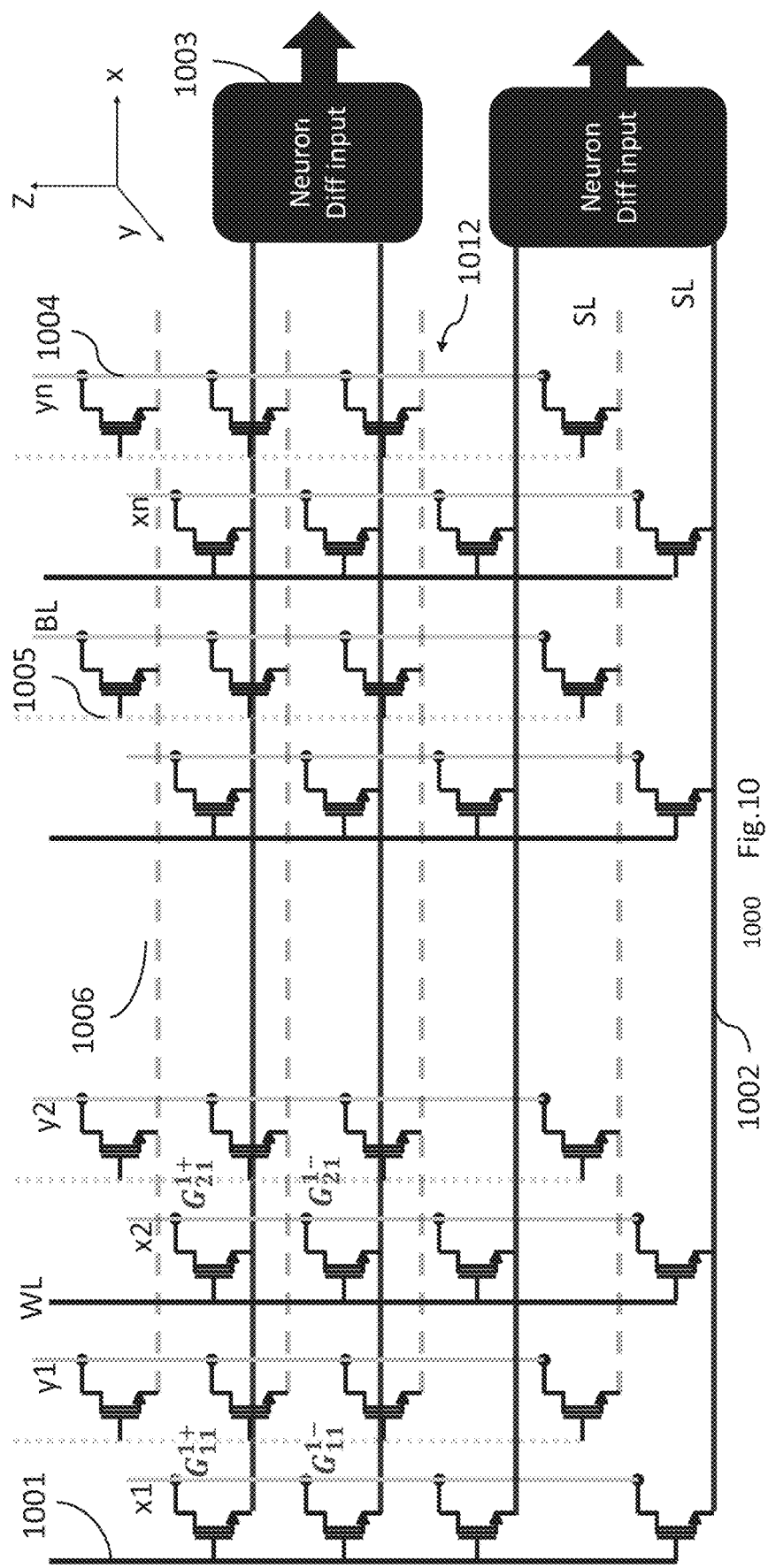
FIG. 10 is a module for multiple VMM using 3D NOR memory array biased in linear mode.

FIG. 10 is a module 1000 for implementing multiple VMM modules using a single 3D memory array operating in linear mode. FIG. 10 shows a 3D memory matrix 1012 or array of transistors similar to those of matrix 812 in FIG. 8, but the connections between WLs as in FIG. 10 are made with vertical metal lines rather than horizontal lines as in FIG. 8. This figure shows how the explained 3D architecture of module 1000 can be used for performing VMM multiplication operations of more than one VMM, such as for k VMMs.

This architecture, is similar to module 800 but here WLs are routed vertically (e.g., see lines 1001 and 1005) rather than horizontally. Since during operation a fixed voltage is applied to all WLs, operation will be the same as module 800 no matter of how WLs are routed or connected. Having the WLs routed vertically may have an advantage of more easily or efficiently programming the transistors of matrix 1012.

In this architecture, the BLs are routed vertically (e.g., see line 1004) such as in module 800. In this architecture, the SLs are routed horizontally to (e.g., see output signal line 1006) output neuron circuitry (e.g., neuron 1003) such as in module 800. The output neuron circuitry can differentially subtract the outputs as noted for module 800.

In some cases, the same architecture as module 1000 can be used to implement the VMM module of FIG. 9 since during operation a fixed voltage may also be applied to the WLs of module 900.

Figure 11:
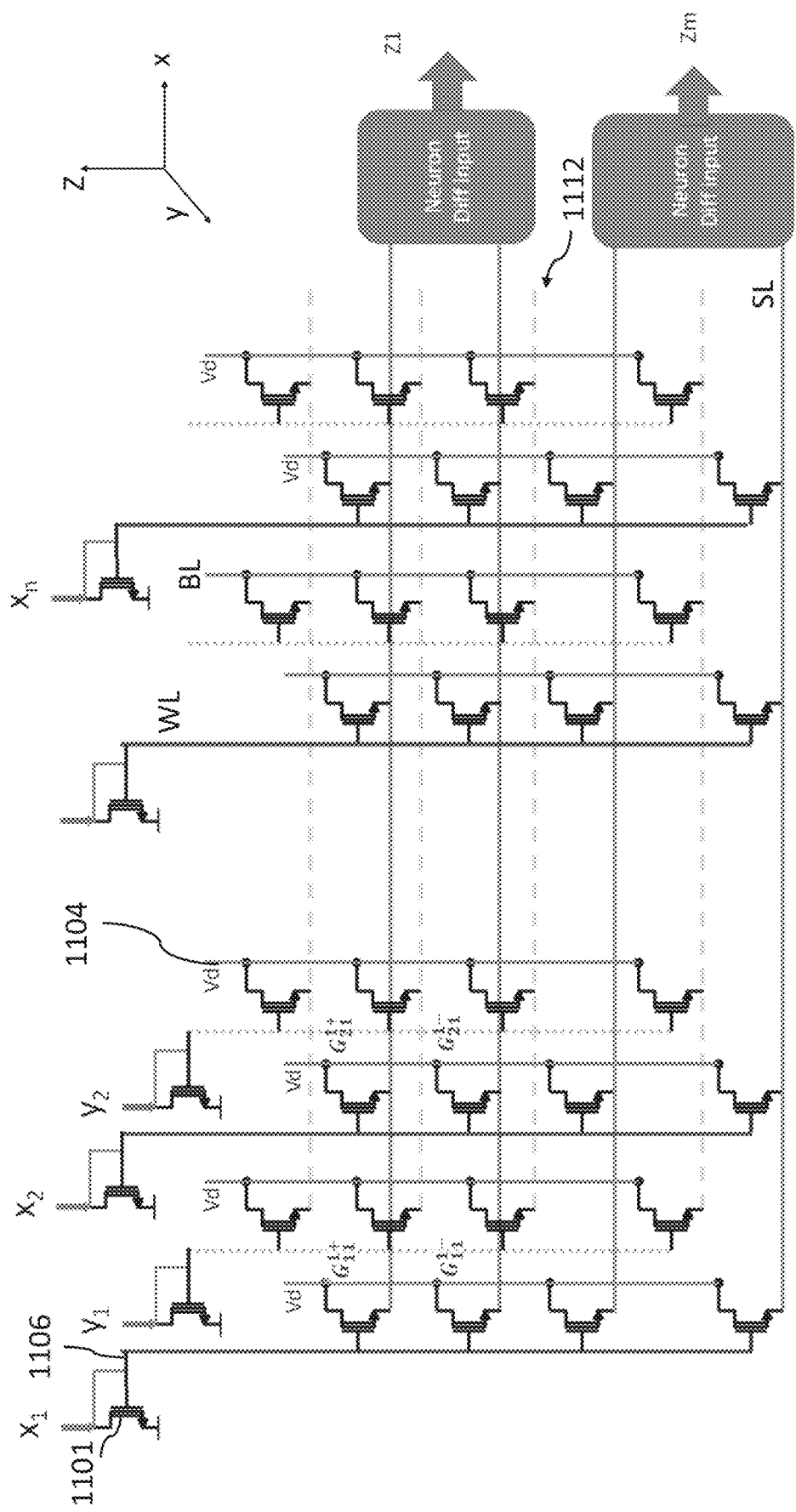
FIG. 11 is a module for multiple VMM using 3D NOR memory array, gate-coupled configuration.

FIG. 11 is a module 1100 for implementing multiple VMM modules using a single 3D memory array biased in subthreshold, where the inputs are applied using a gate-coupled configuration. FIG. 11 shows a 3D memory matrix 1112 or array of transistors similar to those of matrix 1012, but implementing VMMs in subthreshold mode. This figure shows how a 3D memory architecture of module 1100 can be used for performing VMM multiplication operations of more than one VMM, such as for k VMMs.

The architecture of module 1100 shows that by configuring the 3D memory architecture of module 1000 in a gate-coupled configuration, an efficient analog input-analog-output VMM module can be implemented.

In this architecture: bitlines (e.g., BL such as bitline 1104) are biased with a small fixed voltage of Vd; and input signals (e.g., x1, . . . , xn, y1, . . . , yn, etc.) are applied to the diode-connected periphery FG or regular transistors (e.g., see transistor 1101) in the form of current.

Since a fixed voltage Vd is applied to all bitlines, they can be implemented in any way, horizontal routing, vertical routing or through a single plane per layer. Here they are shown implemented vertically.

The periphery transistors accepting inputs convert the current to voltage biasing the WLs of the FGs in the array (e.g., a voltage on line 1106 biasing the WLs of the transistors T of matrix 1112). FGs inside the 3D array convert these voltages back to current based on their programmed states G (e.g., which is based on the weight or charge Q stored in the transistor) and these currents are added up on the source lines SL in the X direction, which are connected to the neuron circuitries that output outputs Z1-Zm. Neuron circuitries are also biasing the source lines SLs. This architecture has an advantage of being more temperature insensitive than other architectures, such as better than modules 800-1000. Each vertical cross-section plane or (Z, X) slice of FG devices in the y direction implement one VMM operation for a total of k VMMs.

Figure 12:
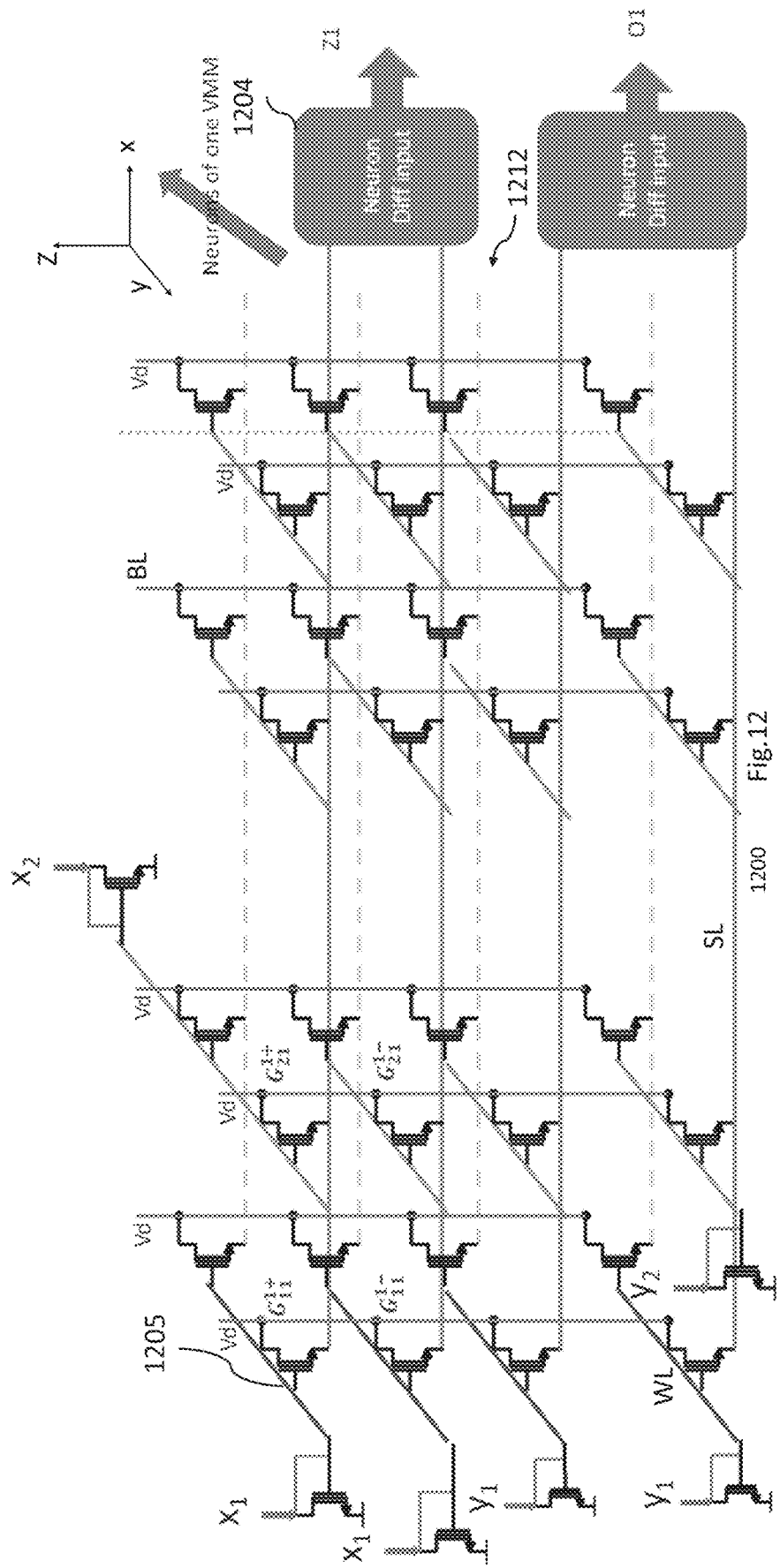
FIG. 12 is a module for multiple VMM using 3D NOR memory array, gate-coupled configuration.

FIG. 12 is a module 1200 for implementing multiple VMM modules using 3D memory array in subthreshold where the inputs are applied using the gate-coupled configuration. FIG. 12 shows a 3D memory matrix 1212 or array of transistors similar to those of matrix 1112, but with the WLs of FGs, T in the 3D array or matrix 1212 routed horizontally (e.g., see line 1205) rather than vertically. The rest of the architecture or operation procedure for module 1200 is the same as module 1100. This figure shows how a 3D architecture of module 1200 can be used for performing VMM multiplication operations of more than one VMM, such as for k VMMs.

The FG transistors inside the architecture of module 1200 can be used both in linear (without periphery circuitry) or subthreshold configurations to implement VMMs. Linear configurations will be similar to what shown for some prior modules since all gates of transistors T will have fixed and similar voltages (e.g., so the operation output is independent of how the WLs are routed). For example, the voltage or biasing of these gates can be routed either vertically, horizontally or in planar mode.

For some cases, similar to what shown for some prior modules where neurons (e.g., neuron 1204) are connected to bitline in source-coupled architecture; the architecture of module 1200 can also be used to implement VMM with source-coupled configuration. In this case, it would not be important how the gates are routed, either vertically, horizontally or in planar mode.

In some cases, architectures of modules 100-1200 can be used in source-coupled, gate-coupled or linear mode. In most of these architectures source and drain can be interchanged.

FIGS. 13-20, provide architectures for routing lines in a matrix or array of floating-gate memory elements that allow faster array programming without reducing area efficiency of these memory arrays (e.g., without increasing hardware or chip area). In some cases, FIGS. 13-20, provide architectures for routing of memory arrays for higher density and faster programming to be used in VMM architectures.

FIGS. 21-25, provide architectures for VMM operation based on in-memory computation with nonvolatile memory devices (e.g., modules 100-1200 and/or architectures 1300-2000) that can be easily configured (for different types of networks with different sizes) while using minimum amount of resources and maximum resource sharing.

The memory cells or transistors in the architectures of FIGS. 13-20 can be floating-gate, charge-trap, SONOS, etc. These memory cells might have single or several gate terminals. For example, a memory transistor or FG may have more than one gate terminal (per each device). Here, a device may have three gate terminals—erase gate, control gate and world line (or main gate). In this case, each terminal is responsible for a particular functionality. Erase gate is used for erasing the devices, WL for operation and control gate controls the programming. However, when a device has a single gate terminal, all these functionalities is done by using the single gate and applying the proper voltages to other terminals (S, D) of the device.

In cases where they have a single gate terminal, the WL routing of FIGS. 13-20 may be implemented using the same WLs. In cases where they have more than one gate terminal the WL routing of FIGS. 13-20 may be implemented using a separate WL (e.g., an erase gate WL or terminal) in addition to the main WLs.

In FIGS. 13-25, when the gate lines are for devices with multiple gates, then the "Erase gate" terminals are routed in a zig-zag form and the other gate routing maintains the routing of the gates. In addition, since device erasure is based upon the voltage difference between gate and source, the routing of source lines can be also changed to zig-zag form in FIGS. 13-20, rather than changing the routing of the erase gates.

The modifications shown in the architectures of FIGS. 13-20 will not have any effect on how the arrays or modules are used during operation since the erase gate routed in a zig-zag form is just used for erasing devices and is biased with a fixed voltage during operation. The architectures of FIGS. 13-20 describe arrays or modules designed to implement analog-input analog-output VMM operation which has applications in AI and neural networks. However, the concepts described for the architectures of FIGS. 13-20 apply to the memory arrays themselves which can be used for any other application as well.

Having access to individually erase memory devices (e.g., transistors T) in the array requires rerouting of erase gate (EG) terminals in the memory architectures like NOR memories which is very costly in terms of area. One main idea is to reroute the EGs so we can erase small blocks of memory devices or transistors every time rather than erasing a single device, a whole row of devices, or a whole column of devices. Such a small block may be between 8 and 64 of the devices. In some case, such a small block is less than half the devices of a row or of a column of the matrix or module. It may be less than a quarter of the devices of a row or of a column of the matrix or module.

Figure 13:
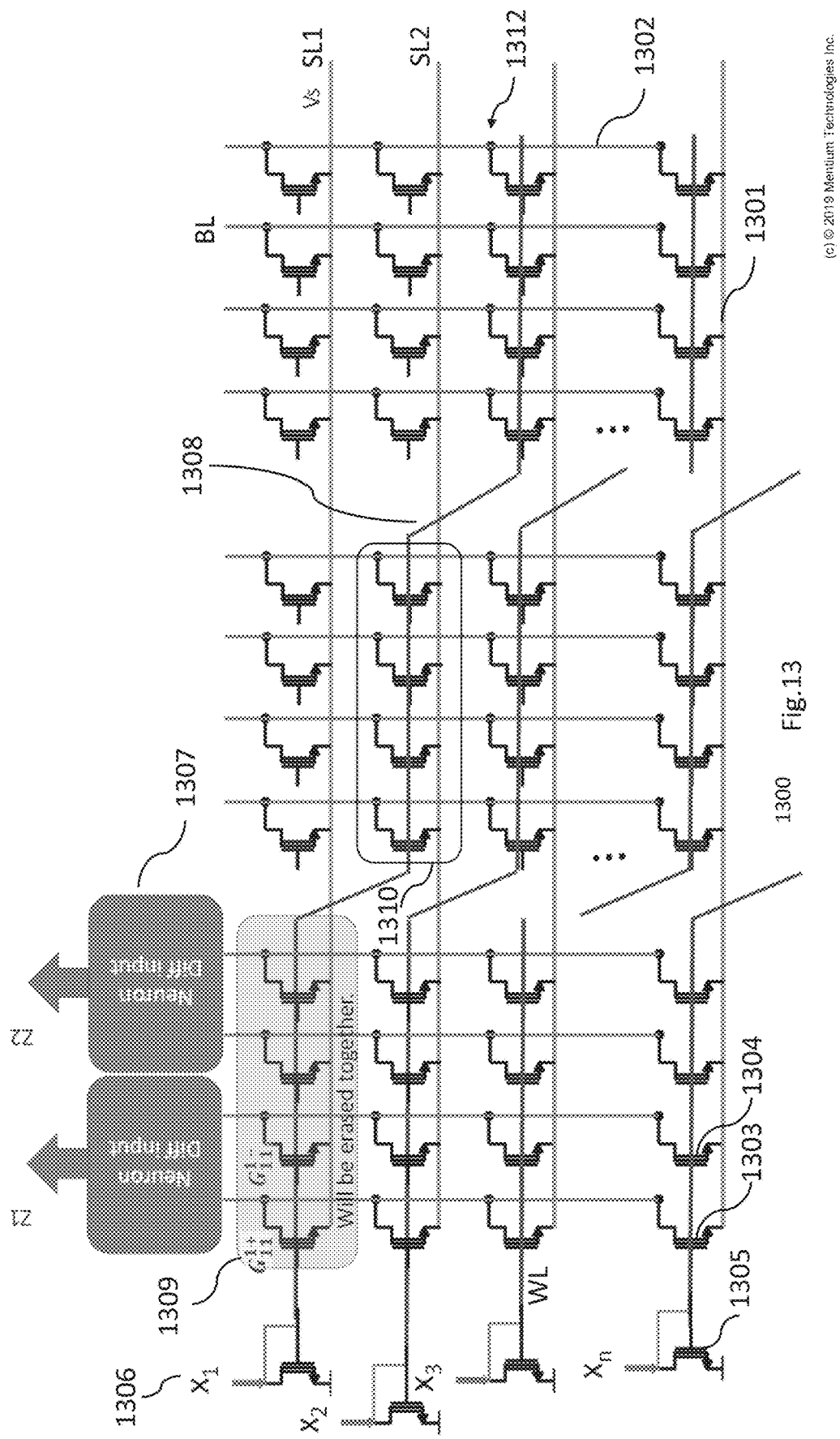
FIG. 13 is an architecture that may be or include a 2D NOR memory array for implementing the VMM operation with erase gate routed in a zig-zag form.

FIG. 13 is an architecture 1300 that may be or include a 2D NOR-like memory array used in the gate-coupled configuration for implementing the VMM operation (for the sake of demonstration only). Architecture 1300 includes 2D NOR memory matrix 1312 or array of transistors. Matrix 1312 may include or be any of the planes or slices of matrixes 812-1212.

Since architecture 1300 is focused on routing of memory array itself for higher density and faster programming, FIG. 13 may not show certain circuitry or components to use the matrix or array to perform meaningful operations like VMM operations. Thus, peripheral and neuron circuitry (i.e., input signal current 1305, input signal voltage line 1306, and subtractor or neuron 1307) may not be shown in FIGS. 13-25, but in some cases are still considered to exist in the architectures 1300-2500. In other cases, the peripheral and neuron circuitry does not exist in and is excluded from the architectures 1300-2500.

In this array or matrix 1312, source-lines SL are connected together row-wise (e.g., see SL 1301) and bit lines are routed vertically (e.g., see BL 1302). In some other cases of a typical NOR memory array (e.g., not the one shown in FIG. 13), gate lines or WLs are routed horizontally in parallel to the source-lines through which memory devices T are getting erased by applying a large enough voltage to these gates to erase the weight or charge Q stored in the device T. In this case, since all the devices located in a row are sharing the source line (SL) and world line (WL), all devices will be erased together. So, in this NOR memory if the memory devices are programmed one by one on a row with analog values, if there is a programming mistake for one of the devices, all devices of the row must be erased and then reprogrammed which is very inefficient and time consuming.

In this new matrix 1312 or architecture 1300, the gates (e.g., the gates or gate terminals used to erase the devices) are routed or connected in a zig-zag way meaning that the gate line (e.g., gate line or WL 1308) will connect several devices (8 to 48) in a row (e.g., group or small block of devices 1309, which is shown in FIG. 13 as 4 transistors representing the several devices) and then move (e.g., zig or zag) to the next row to connect to the next several devices 1310. The zig-zag connection may extend from one end to the other end of a row or matrix 1312.

This zig-zag routing may connect small blocks of memory devices or transistors (e.g., devices 1309 or 1310) together so that they can be address an erased together at the same time without erasing any of the other devices in the row, column, plane or matrix 1312.

So, in this case the first set of devices 1309 will have a different SL than the second set of devices 1310. Now the first set of devices can be erased by applying a large voltage to the gate line (e.g., gate line or WL 1308) while the first SL, SL1 is grounded (low voltage). During erasing of the first devices 1309, the second set of devices 1310 sharing the same gate line 1308 will not be erased (e.g., when proper voltage applied to their SL) since now they have different SL, SL2. Based on the size of the array and the number of devices connected through the WL in each set, the zig-zag WL can span several vertically disposed rows (or even all of the rows of the entire matrix or array). To summarize, in this architecture, instead of erasing all of the whole row, a small portion of the row can be erased. Also, since a very small physical chip area is needed to route the WLs between rows to form the zig-zag connection, the area efficiency of this memory array is close to the area efficiency of the original NOR memory array where WLs were routed in parallel to the source lines.

Although the rerouting of WL in matrix 1312 is done to speed up the programming phase, during operation the WLs can also be used as they were being used before (e.g., see slices in FIGS. 8-12). For example, the FIG. 13 also shows how the array or matrix 1312 can be used for the implementation of gate-coupled analog-input analog-output vector by matrix multiplier. Notably, although matrix 1312 has zig-zag connections (e.g., connection 1308), each of those connections is still for a "row" of memory devices extending from one end to the other end of the matrix. During operation, the output of the row can be obtained by activating that row using one zig-zag connection (e.g., connection 1308) and obtaining the output currents along the matrix BLs (e.g., BL1+BL2 . . . BLn, which are connected to neuron circuitries). In other words, now only those devices belong to first row are the devices that have a same WL (e.g., WL 1308) because that WL is the only WL that is biased with the activation signal of the first applied input X1.

Moreover, when what determines whether a memory device or transistor gets erased or not is the voltage difference between the gate (WL) and the source (SL) of the device, the same innovation of zig-zag routing the WL lines will be also valid if instead of zig-zag routing WL lines, the SL lines are routed in a zig-zag routing as explained below. In this case WLs can be routed horizontally along each row, connecting all devices on a row together, and the SL lines will connect a small block or portion of devices of each row together before going to the next row (e.g., see FIG. 16).

Figure 14:
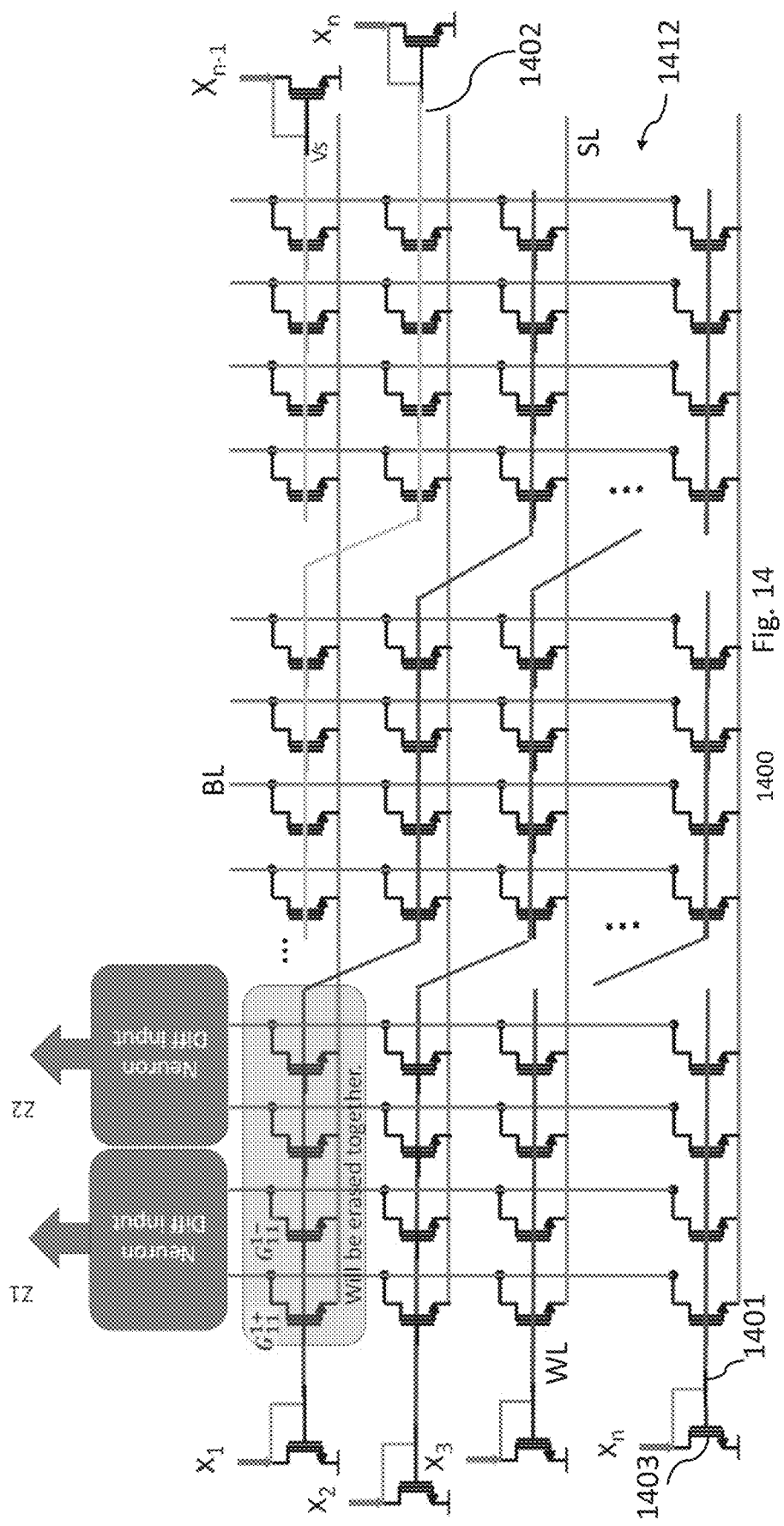
FIG. 14 is an architecture that includes a 2D NOR memory matrix for implementing the VMM operation, with gate zig-zag routing for full array utilization.

FIG. 14 is an architecture 1400 that may include a memory array of 1412, the modified 2D NOR memory matrix of 1312 with gate zig-zag routing for full array utilization.

FIG. 14 shows how in the architecture of FIG. 13, inputs can be applied to the array such a way that 100% of the array with zig-zag gate connections can be used for operation. Since the WL (or SL) are routed in a zig-zag configuration, in order to be able to use the whole rows of the array in operation, some (or all) input signals might be required to be applied to two different WLs in such a way that on each BL, there would be a device with a WL connected directly or indirectly (in the case of source-coupled of gate-coupled) to one of the inputs.

For example, since on the last row only the first set of devices are connected to input Xn (through the line 1401), Xn needs to also be applied to the periphery circuitry connected to line 1402 so that all BLs will have a device connected to the input Xn (note: in VMM, each output is the weighted sum of all the inputs).

Note that the diode-connected periphery transistor of line 1403 can be a regular or FG transistor. This device can also be part of the architecture 1400, separated from the original array 1412 and configured in a diode-connected configuration using some switches. The same array with zig-zag routed world lines shown in architecture 1400 can be used for the implementation of other configurations like source-coupled, etc.

Figure 15:
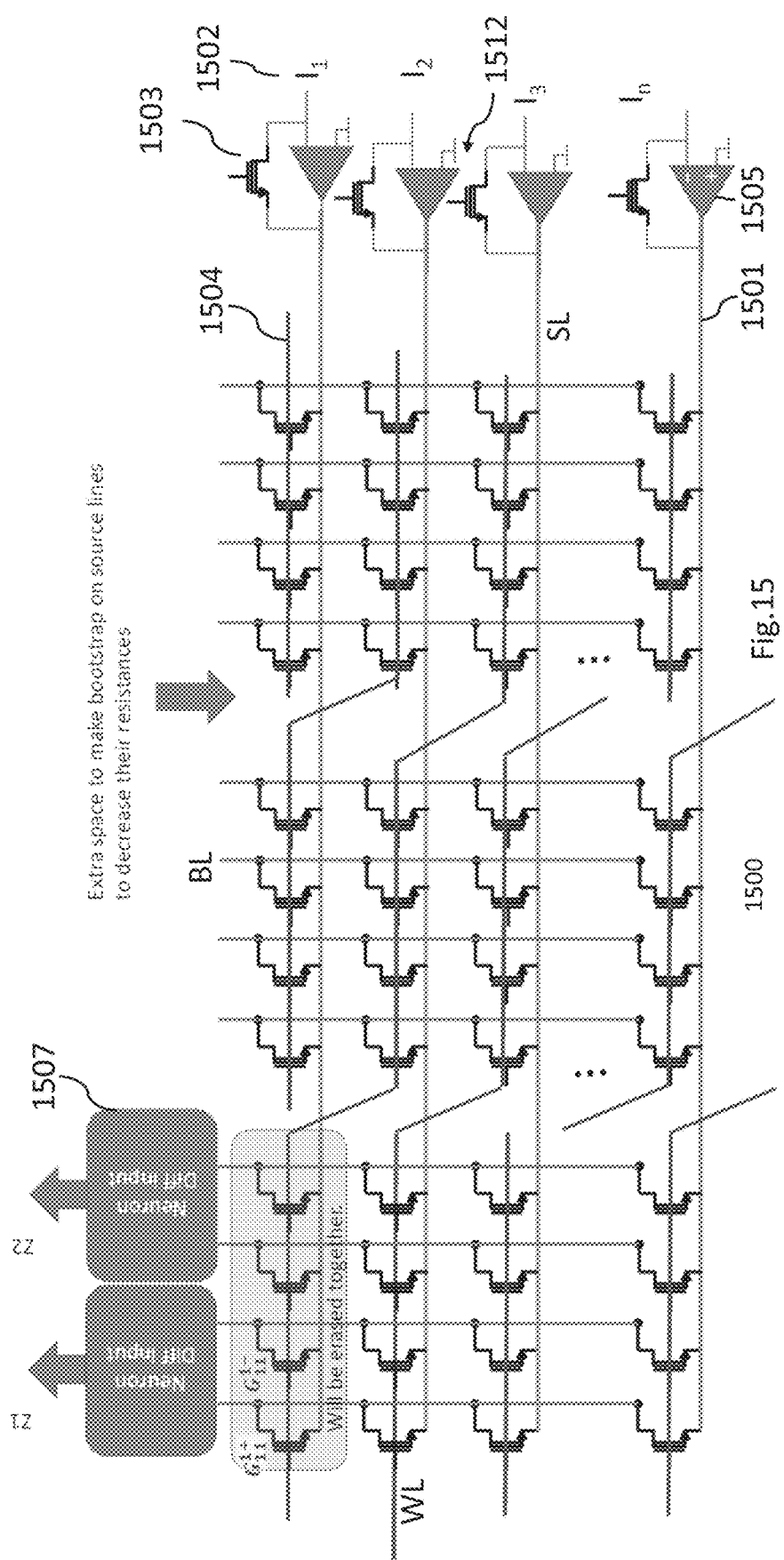
FIG. 15 is an architecture that includes a 2D NOR memory matrix used in a source-coupled configuration for implementing the VMM operation, with gate zig-zag routing.

FIG. 15 is an architecture 1500 that may include as matrix 1512 the 2D NOR-like memory matrix 1312 or array used in a source-coupled configuration for implementing the VMM operation, with gate zig-zag routing. FIG. 15 shows how the architecture of FIG. 13 or 14 can be used in a source-coupled structure (e.g., SLs of the rows of memory devices are biased by voltages which are proportional to input signals $I_1$-$I_n$ and generated with neuron circuitry) to implement a VMM operation.

The input currents $I_1$-$I_n$ (e.g., see input 1502) are applied to operational amplifiers attached to each SL (e.g., see opamp 1505) with feedback transistors (e.g., see transistor 1503). These input circuitries convert the input currents to voltage logarithmically which is then applied to the source lines (e.g., see input voltage at SL 1501). The FG transistors inside the array or matrix 1512 convert these voltages back to current which are then added up on the bitlines BL using the neuron circuitry (i.e., see subtractor or neuron 1507)

Since in this architecture 1500 and during operation, the voltages on the WLs (e.g., see WL 1504) as well as the voltage on the gate of the feedback transistors (e.g., see transistor 1503) are fixed, routing the WLs in a zig-zag way (e.g., see FIG. 13 or 15) will not have any effect on the operation phase because a fixed voltage can be applied to all of the WLs of the zig-zag configuration independent of how they are routed in the array.

Figure 16:
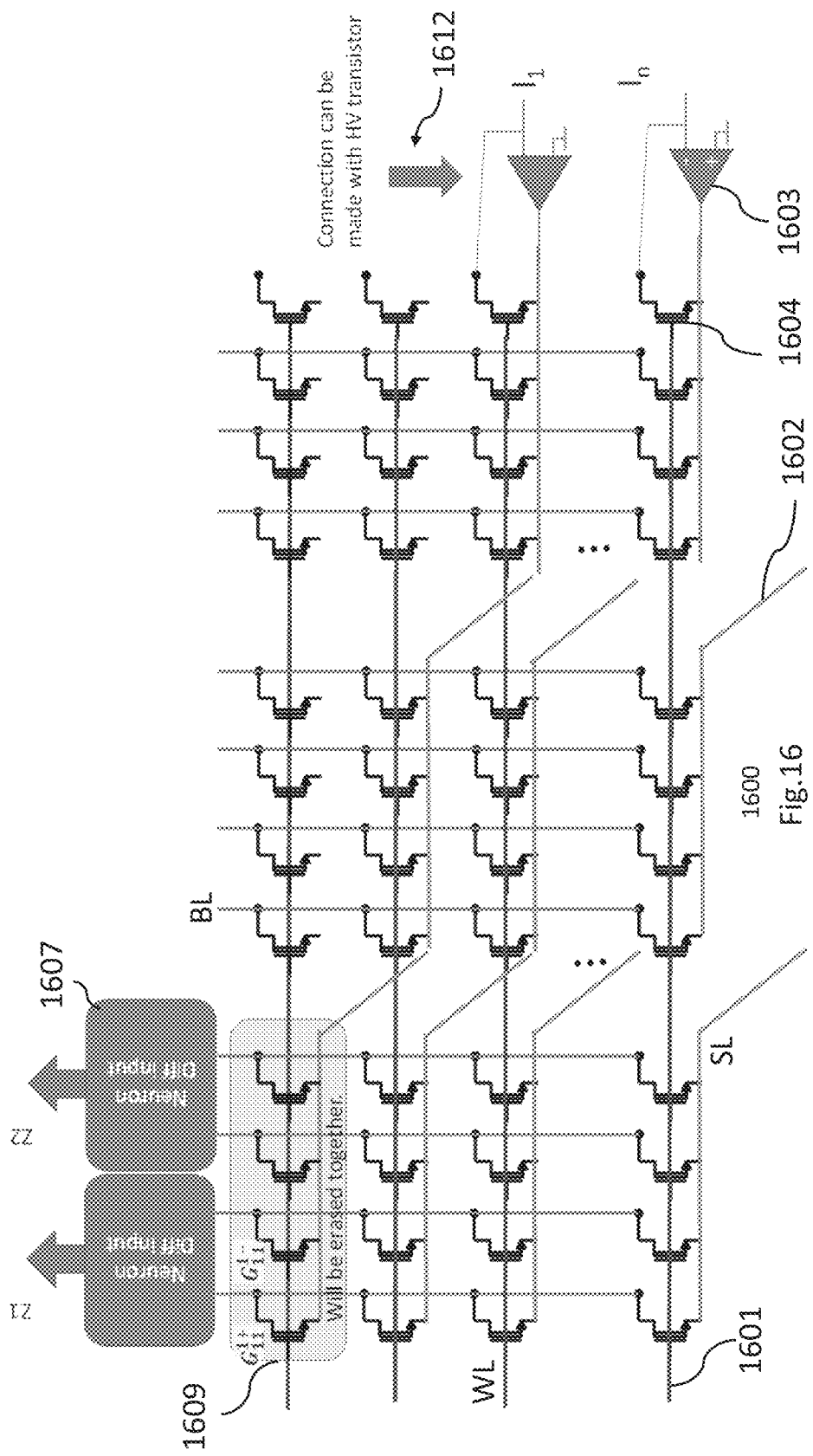
FIG. 16 is an architecture that includes a 2D NOR memory matrix used in a source-coupled configuration for implementing the VMM operation, with source zig-zag routing.

FIG. 16 is an architecture 1600 that may include as matrix 1612 the 2D memory matrix or array with source zig-zag routing used in a source-coupled configuration for implementing the VMM operation for the sake of demonstration. FIG. 16 shows how the architecture of FIG. 15 can be used in a source-coupled structure when instead of WLs, SLs are zig-zag routed to implement a VMM operation.

In this array or matrix 1612, gate-lines or WL are connected together row-wise (e.g., see WL 1601) and bit lines are routed vertically (e.g., see BL). In matrix 1612 or architecture 1600, the source lines (e.g., the sources or source terminals) are routed or connected in a zig-zag way meaning that the source lines (e.g., source line or SL 1602) will connect a group or small block of devices (e.g., small block 1609, which is shown in FIG. 16 as 4 transistors representing the small block) in different rows in a zig-zag configuration. This SL zig-zag configuration will connect the memory devices in each row to be erased in small blocks similar to erasing as noted for the WL zig-zag configuration of FIG. 13.

As mentioned before, here what determines whether a memory device or transistor gets erased or not is the voltage difference between the gate (WL) and the source (SL) of the device, thus either WL (e.g., FIGS. 13-15) or SL (FIG. 16) can be routed in a zig-zag way for speeding up the programming of the devices in the array.

FIG. 16 similar to FIG. 15 shows how the proposed array 1612 can be used in the source-coupled configuration to perform VMM operation but with two differences. First, instead of zig-zag routing of WLs (e.g., see WL 1601), here the SLs (e.g., see SL 1602) are routed in a zig-zag configuration. Secondly, the feedback transistors of the input circuits (e.g., transistor 1604 which combined with opamp 1603 forms the input circuitry for a SL) can be implemented by FG transistors located inside the original array 1612.

These feedback FG transistors will convert the input currents $I_1$-$I_n$ to voltage input shared on the SLs of FG devices (e.g., memory devices) of matrix 1612. These input circuitries will also have the output of their opamps connected to the SLs routed in a zig-zag configuration.

As noted above, the concepts described for architectures 1300-1600 can be applied to single gate (or gate terminal) memory devices as well as to multiple gate (or gate terminal) memory devices. For arrays or matrixes that (instead of single gate transistor) have a two, three or four-gate transistor, the zig-zag WL and SL routing described for architectures 1300-1600 can also be applied to these arrays having multiple gate memory devices.

For example, for multiple gate memory devices, there is one erase gate which is responsible for erasing the devices. Thus, this erase gate can be routed in a zig-zag way as explained above and the other gates (e.g., control gate, word line and/or main gate) can be routed and used without any modification for processing and implementing the VMM. Including the zig-zag WL or SL routing allows for erasing a smaller number of devices at one time (e.g., each step of erasing devices) by applying proper voltages to terminals (e.g., BL, WL and SL) of the array, and avoids erasing other devices of the array or matrix.

Figure 17:
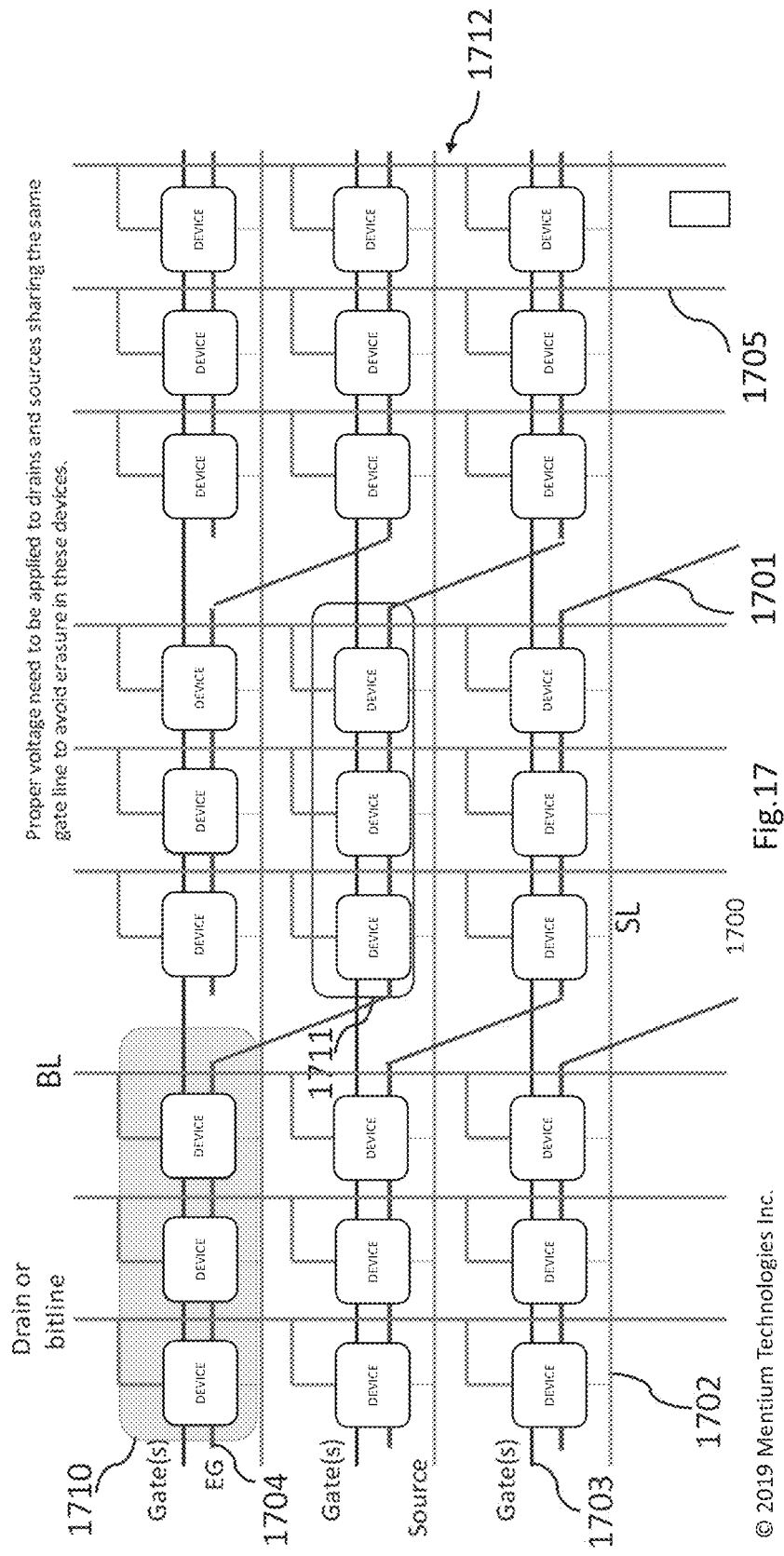
FIG. 17 is an architecture that includes a 2D NOR memory matrix of multiple gate memory devices with erase gate (EG) zig-zag routing.

FIG. 17 is an architecture 1700 that includes a 2D memory matrix 1712 of multiple gate (e.g., multiple gate terminal) memory devices in a matrix or array, but with erase gate (EG) zig-zag routing instead of WL zig-zag routing. In some cases, FIG. 17 shows how the architecture of FIGS. 13-16 can be used in an array having multi-gate memory devices.

The matrix 1712 or array includes of bit lines (e.g., line 1705), source lines (e.g., line 1702), one or multiple gates that are not the erase gate (e.g., line 1703), and an erase gate responsible for device erasure (e.g., line 1704). For arrays with a single gate, this gate will be the erasure gate as well, and these arrays may be covered by FIGS. 13-16.

To erase a portion or small block of devices in each row rather than the whole row or the entire matrix 1712, an EG (e.g., line 1704) is routed in a zig-zag configuration meaning that after connecting several devices in one row, it will go to the next lower row and connect several devices in that row, and then to a subsequent lower row as shown.

More specifically, in matrix 1712, first gate-lines (e.g., control gate, word line and/or main gate) are connected together row-wise (e.g., see gate line 1703) and bit lines are routed vertically (e.g., see BL or line 1705). Also, the source lines are connected together row-wise (e.g., see SL or line 1702).

In matrix 1712 or architecture 1700, the EGs (e.g., the erase gate terminals that are used to erase the devices) are routed or connected in a zig-zag way meaning that the EG lines (e.g., EG lines or line 1704 and 1701) will connect a group or small block of devices (e.g., small block 1710, which is shown in FIG. 17 as 3 memory devices or transistors representing the small block) and then move (e.g., in a zig-zag configuration) to the next row to connect to the next several devices 1711. The zig-zag connection may extend from one end to the other end of a row or matrix 1712. This EG zig-zag configuration will connect the memory devices to be erased in small blocks similar to erasing as noted for the WL and SL zig-zag configurations of architectures 1300-1600.

In this case, the batch or small block of devices connected to each EG in each row can be erased together without altering the state of other devices in that row or other rows by applying proper voltages to the other terminals of the array.

In some embodiments the source lines are zig-zag routed instead of EG, such as shown for FIG. 16 as compared to FIGS. 13-15. Analog programming of memory devices in the array can be performed as described before for FIGS. 1-15 and by modulating the amplitude or width of the programming pulses. The EG zig-zag configuration concept of FIG. 17 can be applied to the architecture when one, several or all the gates other than the EG are routed vertically rather than horizontally. Thus, FIG. 17 shows expanding the proposed zig-zag configuration to a general case, such as expanding the explained concepts to any memory array independent of the type of memory device.

It is noted that in all of the above FIGS. 1-17, the same module, matrix, architecture and/or array can be used to implement the VMM operations or other operations by biasing the memory device transistors in linear region. For example, in the architecture of 1700, inputs can be applied to bitlines in the form of voltages, gates biased with voltage levels appropriate for operation, and the resulting outputs of the memory devices can be read from the source lines. In this case the output current of each memory device will be the multiplication between the device's conductance G (e.g., which is based on the stored weight or charge Q) and the voltage applied to its bitline or drain (drain-source voltage).

Figure 18:
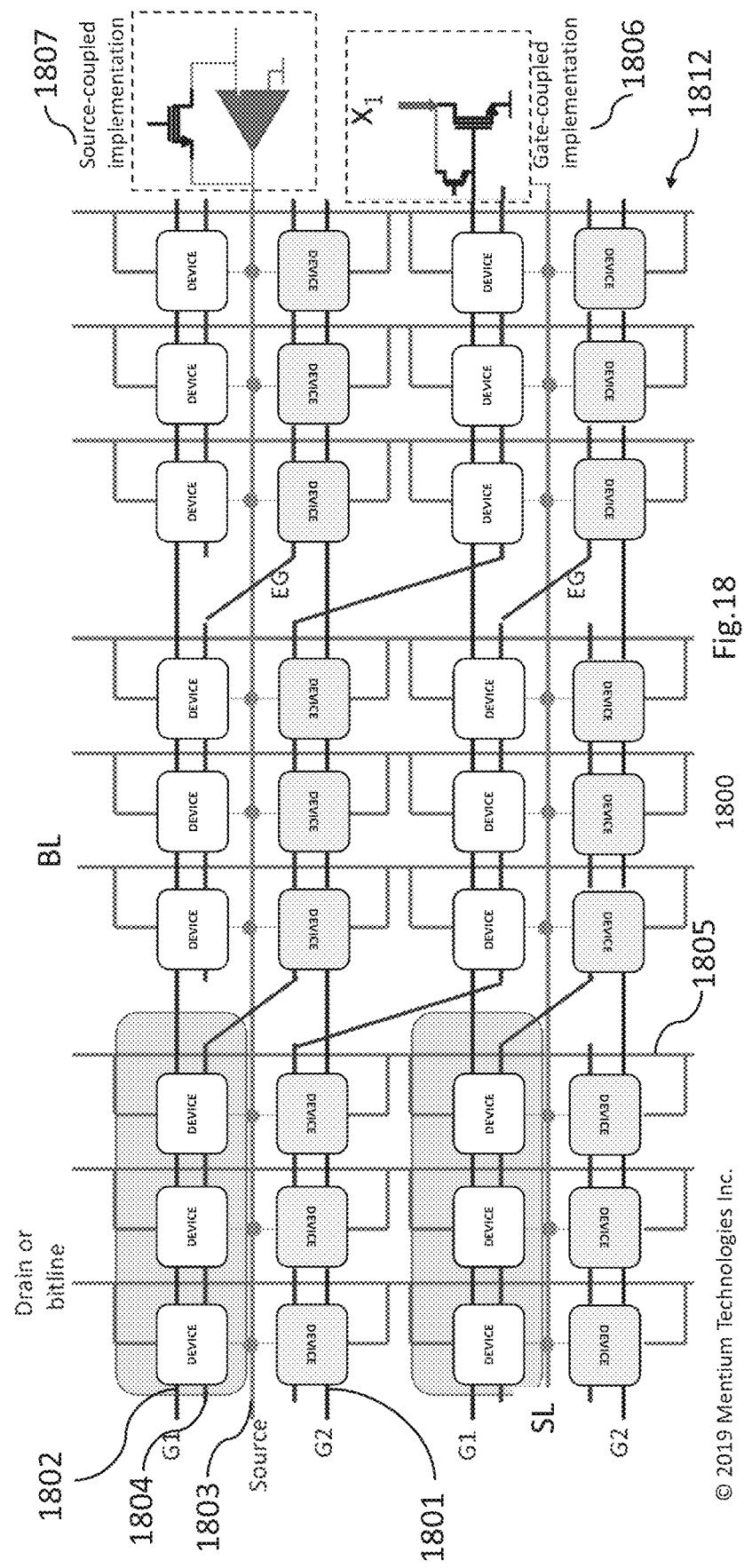
FIG. 18 is an architecture that includes a 2D NOR memory matrix based on supercell devices sharing source lines with erase gate (EG) zig-zag routing.

FIG. 18 is an architecture 1800 that includes a 2D NOR-like memory matrix 1812 which is matrix 1712 with the difference that it uses supercell memory devices meaning that each source line is shared between two rows of devices. In some cases, FIG. 18 shows how the architecture of FIG. 17 can be used based on supercell memory elements.

The matrix 1812 or array includes of bit lines (e.g., line 1805), source lines (e.g., line 1803), one or multiple gates that are not the erase gate (e.g., line 1802), and an erase gate responsible for device erasure (e.g., EG and/or line 1804).

To erase a portion or small block of devices in each row rather than the whole row or the entire matrix 1812, an EG (e.g., line 1804) is routed in a zig-zag configuration meaning that after connecting several devices in one row, it will go to the next lower row and connect several devices in that row, and then to a subsequent lower row as shown.

FIG. 18 is the same as FIG. 17 but it is based on supercell memory devices meaning that a source line (e.g., SL 1803) is shared between two rows of the memory cells in the array (e.g., the row with gate line G1 and the row with gate line G2) to minimize the footprint area of architecture 1700 on a chip or hardware device. In this case, the memory devices of vertically adjacent rows can be addressed or are distinguished (e.g. to be erased and/or during operation) from one another by using or through their different bit lines (e.g., BL or line 1805), different gates (e.g., WL; or line 1801 as compared to line 1802), or by both their BL and WLs.

Similar to FIG. 17, this matrix 1812 includes zig-zag routing of EG (e.g., line 1804). The figure shows the case where each zig-zag configured "row" has its own EG extending from one end to the other end of the matrix 1812. However, the concept shown in the figure is also valid if the EG is shared between the two rows of the array making supercells, such as if line 1804 addresses the EG terminals of the same vertical small block of memory devices in rows with G1 and with G2.

Since the EG line have no effect during operation and is biased with fixed voltage, this architecture can be used for operation or computation the same way as it was used before having the zig-zag configuration for EG.

For example, blocks 1806 and 1807 show how input signals can be applied to WLs and SLs (respectively) of the matrix 1812 or array to perform VMM operations for the configurations of gate-coupled and source-coupled, respectively (e.g., as also demonstrated in FIGS. 1-17).

In some cases, in this architecture, memory devices located on vertically adjacent rows (e.g., the first and second rows) are sharing the same SL and supercell devices in these two rows are sharing the same bitlines. Thus, during operation, for the case of source-coupled implementation, these adjacent two rows cannot be used at the same time to perform for example vector by matrix multiplication. However, these vertically adjacent rows can be selected to be used at different times through their different gates (e.g., select line 1801, or line 1802) or they can be used to implement different VMMs during operation. For example, to implement different VMMs during operation, odd rows can be selected to implement a first VMM and even rows can be selected to implement a second VMM. Thus, the architecture 1800 provides better area efficiency since all the periphery, decodes, and/or neuron circuitries can be shared between the odd and even row VMMs during operation. For example, when performing operations using one of these VMMs (e.g., odd or even rows), the devices belonging to the other one can be turned off by applying proper voltage to their different gates.

Figure 19:
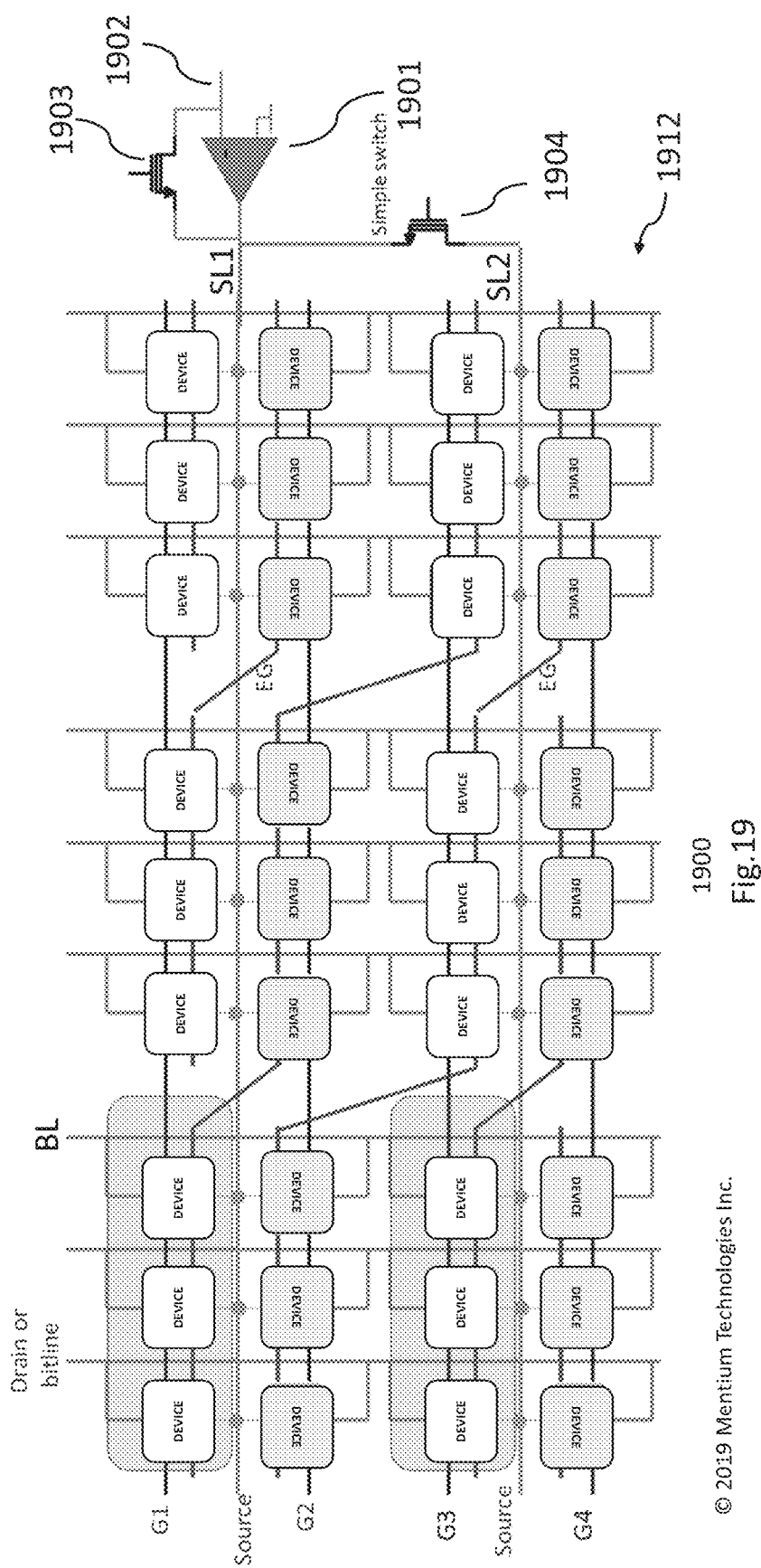
FIG. 19 is an architecture that includes a 2D NOR memory matrix based on supercell devices sharing source lines with erase gate (EG) zig-zag routing for maximum sharing of input circuitry.

FIG. 19 is an architecture 1900 that includes a 2D NOR-like memory matrix 1912 which is matrix 1812. In some cases, FIG. 19 shows how the configuration of architecture 1800 (either with or without zig-zag routed EGs) can be used with input circuitry that is shared between four rows of the array.

Architecture 1900 is the same as architecture 1800 (for the case of source-coupled configuration), except that in architecture 1900 the input circuitry (e.g., 1901-1904 as compared to 1806 or 1807) is shared between four vertically adjacent rows of the matrix 1912 or array and therefore is able to implement four VMMs during operation (one at a time), using a single input and output circuitry. In this architecture 1900, the input current/signal is applied to the input circuitry (e.g., at line 1902) at an operation amplifier (e.g., opamp 1901). This opamp (e.g., 1901) with its FG feedback transistor (e.g., at transistor 1903) converts the input current to an input voltage that can be applied to multiple source lines (e.g., and thus to 2 vertically adjacent rows per source line) using transistor switches. For example, FIG. 19 shows the input voltage being applied to SL1 and through switch 1904 to vertically adjacent SL2, which are connected to four vertically adjacent rows (e.g., having gates G1-G4) of the matrix 1912 or memory array. Now the FGs inside the matrix 1912 or array seeing this voltage on their source line can convert this voltage back to current based on their internal state G (e.g., which is based on the store weight or charge Q) provided that an appropriate voltage is applied to their gates G1-G4 (i.e., the devices belonging to the same VMM are turned on while the other devices belonging to the other VMMs are turned off).

Here, since the bitlines are shared between the supercell devices, four different VMMs can be implemented in this architecture where the input and output circuitries are shared between those rows (so the rows can be used one at a time for each VMM during operation). The first row of the matrix 1912 or array can implement a first VMM when it is activated through gate G1 (e.g., and the appropriate BL and SL are applied). The second row of the matrix/array an implement a second VMM when it is activated through gate G2 (e.g., and the appropriate BL and SL are applied); and so on for G3 and G4.

Figure 20:
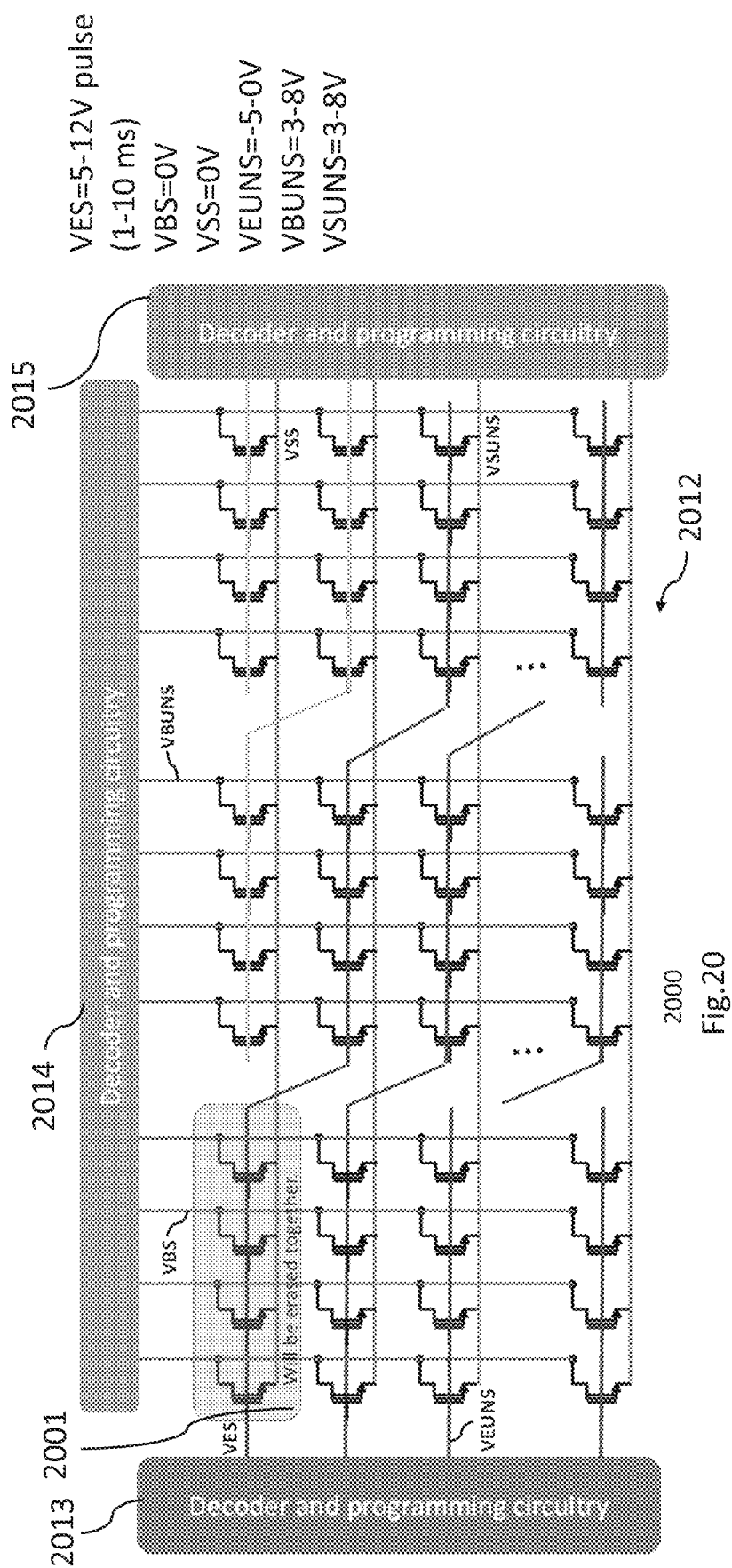
FIG. 20 is an example of voltages applied by an input or erase circuitry to erase devices in an array with zig-zag configured/routed erase gates (EGs).

FIG. 20 is an architecture 2000 having input or erase circuitry 2013-2015 for providing input voltages to erase zig zag configured/routed EGs. Architecture 2000 may be a voltage-based example for erasing a batch or small block of selected memory devices in any of architectures 1300-2000.

For example, FIG. 20 shows a non-restricting example of the input circuitry and/or voltages to be applied to rows and columns of the modified array (with zig-zag routing such as in architectures 1300-2000) in order to only erase the batch or small block of selected devices (e.g., small block 2001) without altering the state of other devices of the row, matrix, array, architecture or module.

More specifically, architecture 2000 includes input circuit 2013 for providing voltage VES to the zig zag configured WL or EG that includes small block 2001; and for providing voltage VEUNS to the other (e.g., possibly zig zag configured) WLs or EGs of the matrix or array of architecture 2000. Architecture 2000 also includes input circuit 2014 for providing voltage VBS to the BL of small block 2001; and for providing voltage VBUNS to the other BLs of the matrix or array of architecture 2000. Next, architecture 2000 includes input circuit 2015 for providing voltage VSS to the SL of the row having small block 2001; and for providing voltage VSUNS to the other rows of the matrix or array of architecture 2000. Since only small block 2001 receive VES, VBS and VSS, only block 2001 will be erased (e.g., only the memory devices or transistors of that block will have their weights or charges removed or reduced to zero). In some cases, VES is a between 5 and 12 Volt pulse (e.g., a plus having length of between 1-10 milliseconds); VBS is 0 Volts; VSS is 0 Volts; VEUNS is between −5 and 0 Volts; VBUNS is between 3 and 8 Volts; and VSUNS is between 3 and 8 Volts.

As noted, FIGS. 21-25, provide architectures for VMM operation based on in-memory computation with nonvolatile memory devices (e.g., modules 100-1200 and/or architectures 1300-2000) that can be easily configured (for different types of networks with different sizes) while using minimum amount of resources and maximum resource sharing. For example, FIGS. 21-25, provide VMM architectures that accept digital data inputs, convert the inputs to analog data inputs, perform the computation (e.g., one or more VMM operations), converts the analog data output computations back to digital data, and store the converted digital data computations in memory for the next operation or directly apply them to the next VMM module or architecture. The architectures of FIGS. 21-25 may also apply activation functions etc. to the outputs of VMM modules or architectures.

The architectures of FIGS. 21-25 may achieve maximum area density by sharing input and output circuitries between different VMM modules or architectures. The architectures of FIGS. 21-25 may correct deterministic errors of circuitries after converting the analog outputs to digital.

Figure 21:
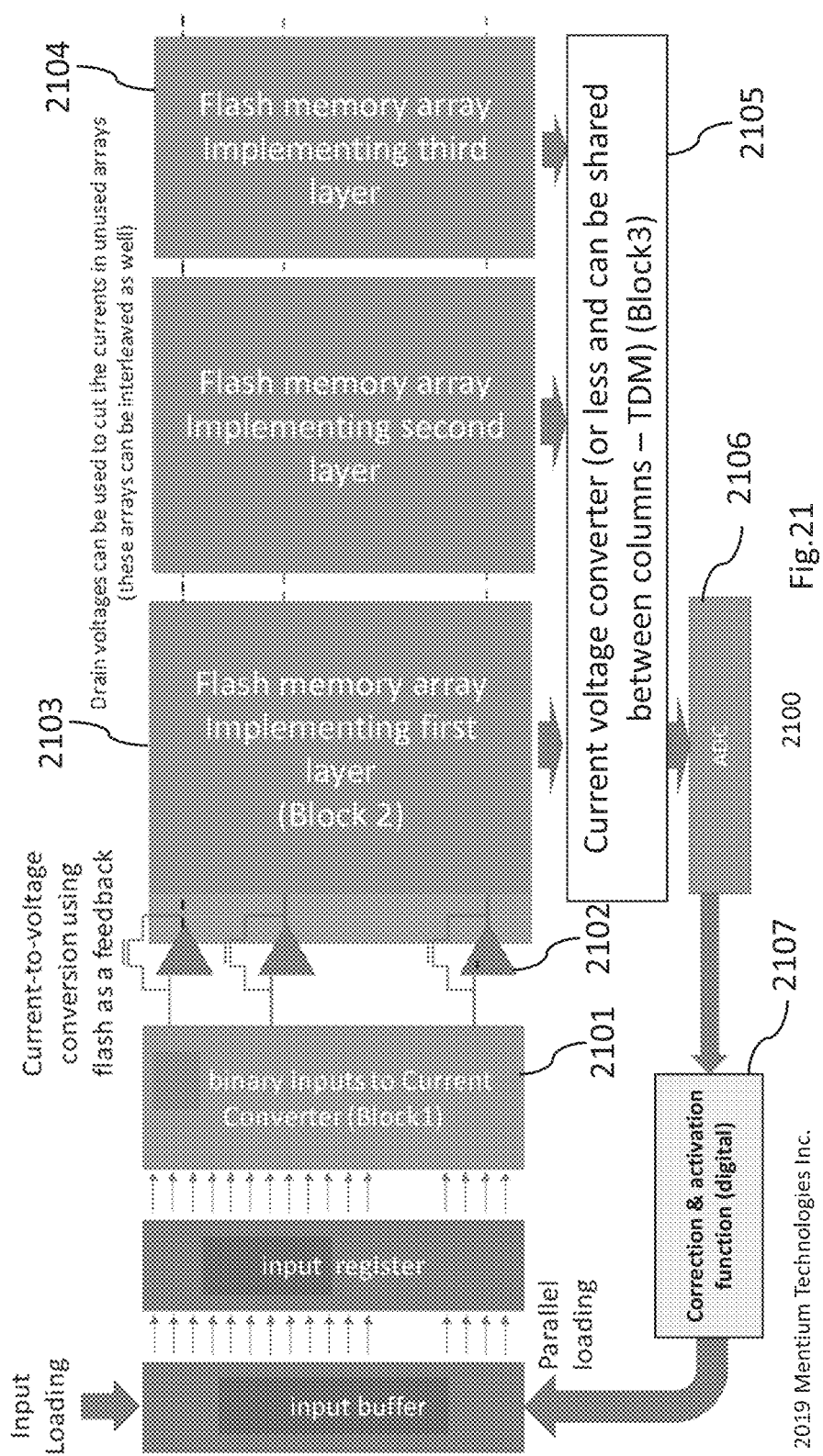
FIG. 21 is an architecture for fast, dense, VMM operation with maximum resource sharing.

FIG. 21 is an architecture 2100 for fast, and dense, VMM operation. Architecture 2100 has input circuitry for providing input signals for operating any of modules 100-1200 and/or architectures 1300-2000 to perform VMM operations. In some cases, architecture 2100 exists within a single IC chip.

For example, in FIG. 21, for VMM operation, digital inputs are first converted to analog current using the dedicated circuits (e.g., see digital to analog (DAC) converter 2101). These currents are then applied to the analog VMM modules such as input signals to WLs, SLs, BLs and the like as explained for FIGS. 1-20. These analog input currents are for example converted to voltage using input circuits (e.g., see circuit 2102 having an opamp and feedback transistor). The generated input voltages are then shared between several VMM modules or architectures so that any or all of them (e.g. e.g., see modules or architectures 2103 and 2104) can perform VMM operations on or using these inputs (hence sharing the input circuitries).

In some cases, one of these modules or architectures will be selected and perform the VMM operation desired. The output of this VMM operation which is in the form of analog current will be converted to digital either directly or by first being converted to voltage (e.g., see converter 2105) and then to digital with analog to digital converters (ADC) (e.g., see ADC 2106). Again, these output circuitries are shared between VMM modules or architectures. Now the produced digital outputs can be processed further as digital data for example by applying an activation function (e.g., see activation function 2107).

Input signals can be loaded serially or in parallel to the first register bank and then loaded to the second register in parallel. The second register can be used to feed the data to the VMM modules while the next input sample is being loaded to the first register bank. In this case when the processing is done, the next sample is ready and can be transferred from the first register bank to the second register bank.

Note that since after analog to digital conversion (e.g., see ADC 2106), the output of calculation will be a digital data in the digital domain, it allows the possibility of easily performing digital post processing of the outputs. Thus, the current to voltage convertor 2105 does not need to be linear or very accurate because any correction for non-linearity or inaccuracy can be formed in the digital domain during post processing. Therefore, any inaccuracies in resistors, capacitors or even nonlinear conversion can be corrected for here. Also note that since this architecture 2100 is performing the computations (e.g., the VMMs or neural network computations) layer by layer, these current to voltage converters

2105 as well as the ADCs 2106 can be shared between the layers, matrixes, flash arrays, VMM modules or architectures.

It is noted that computing architecture 2100 is very flexible since it allows implementing a variety of NN configuration within a single chip because the inputs and outputs of each VMM module are digital. Single-layer NN, multi-layer neural networks with one or more hidden layer NN, different activation functions, different number of hidden neurons all can now be implemented with this chip by using a digital control unit managing the process.

Figure 22:
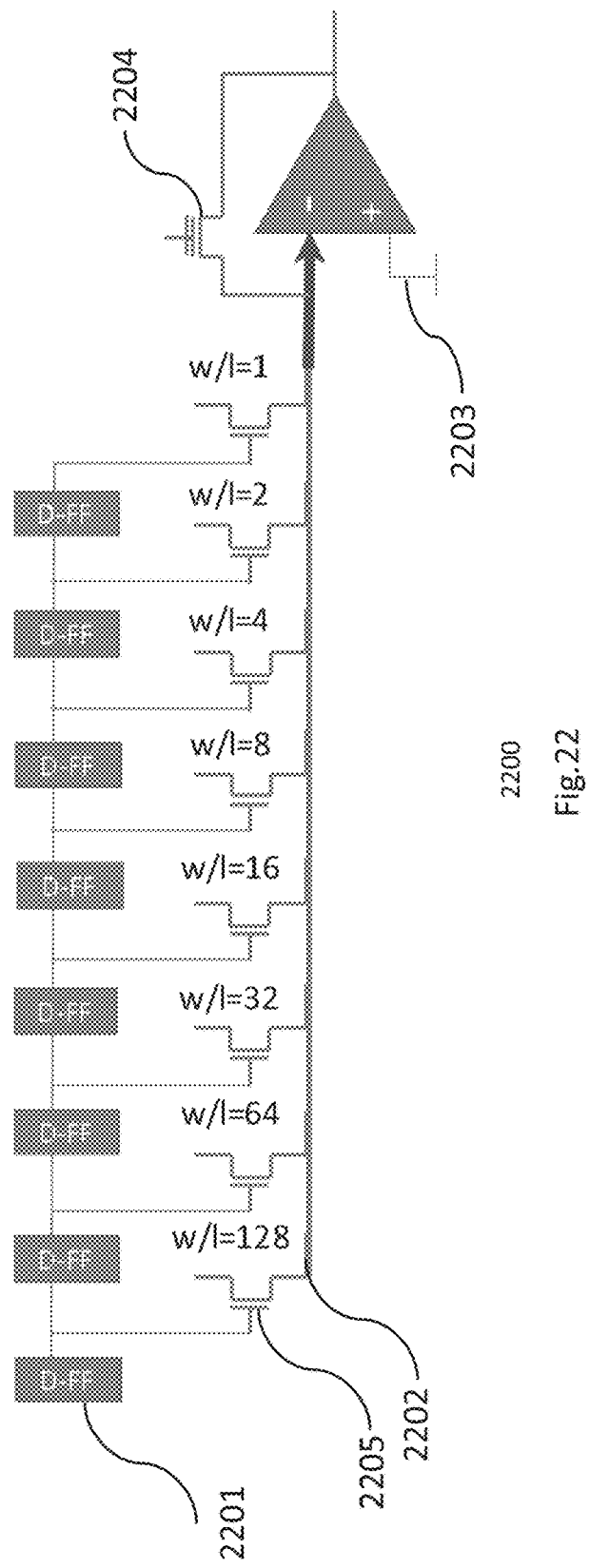
FIG. 22 is an architecture for a digital to analog convertor (DAC) using regular or floating gate (FG) transistors.

FIG. 22 is an architecture 2200 for a digital to analog convertor (DAC) using regular or FG transistors. Architecture 2200 may perform DAC as required for any circuitry for programming and/or operating any of modules 100-1200 and/or architectures 1300-2000. For example, architecture 2200 may be DAC 2101.

Architecture 2200 may store digital inputs in digital flip-flops (D-FFs) 2201, and those inputs are directly applied to gates or drains of the memory devices 2205. In the case of regular transistors, these devices are sized such a way that for the applied voltages, the current of the next device be twice the current of the previous device (binary weighting the input bits). In the case of FG transistors, this sizing of the device current is achieved by proper programming the state G (e.g., which is based on the weight or charge Q) of the devices. By applying these binary inputs and properly biasing the drain (or gate if the bits are applied to drains), the output current will be the analog representation of the input binary number for each transistor. The sum of these current is input to the negative input of an opamp. Architecture 2200 now passes this current from a feedback transistor 2204 of an opamp, to convert the current into a voltage which then can be shared between different VMM modules or architectures.

Note that the voltage applied to positive input 2203 of the opamp will determine the biasing of the source line 2202 which will determine the amplitude of the current when the applied bit is high or "1".

For the case of using FGs for the transistors, better weight accuracy can be achieved by using several devices in parallel that are all programmed to the same state.

Figure 23:
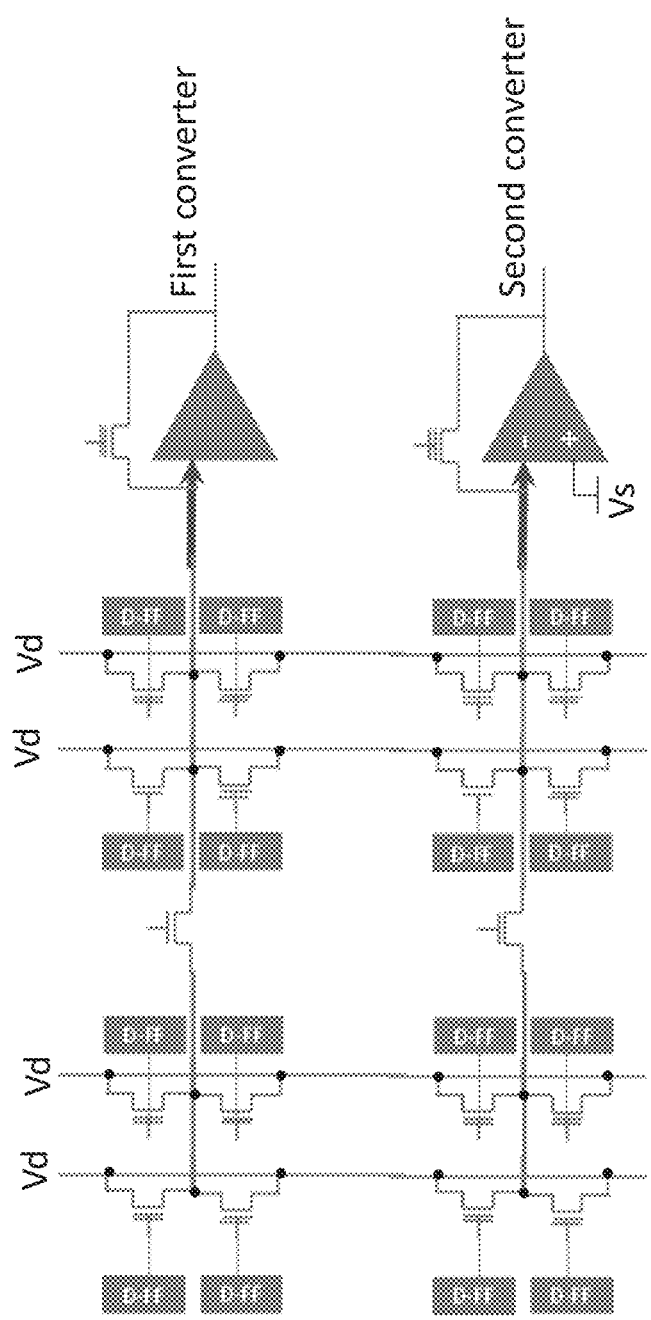
FIG. 23 is an architecture for a digital to analog convertor (DAC) using FG supercell transistors.

FIG. 23 is an architecture 2300 for a digital to analog convertor (DAC) using FG supercell transistors. Architecture 2300 may perform DAC as required for any circuitry for programming and/or operating any of modules 100-1200 and/or architectures 1300-2000. For example, architecture 2300 may be DAC 2101.

Architecture 2300 may be an example of how the proposed circuit of FIG. 22 can be implemented with a NOR-like memory array and when more than one output (or digital to analog converter) is required. This architecture is similar to architecture 2200 but with different arrangement of D-FFs and regular/FG transistors so it maps well to the known NOR-like memory arrays.

Figure 24:
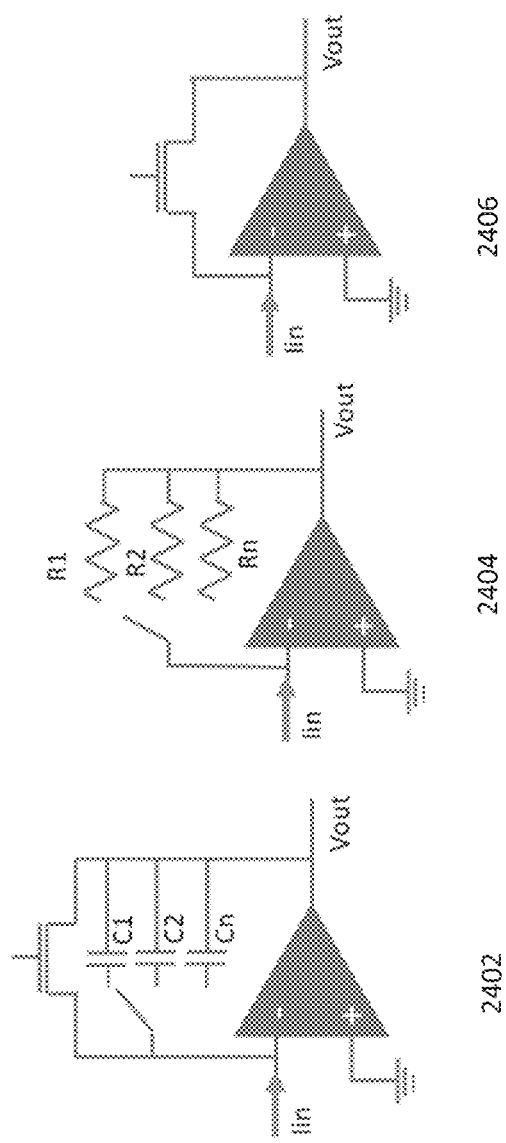
FIG. 24 is an architecture for a current to voltage convertor.

FIG. 24 is an architecture 2400 for a current to voltage convertor. Architecture 2400 may perform current to voltage conversion as required for any circuitry for programming and/or operating any of modules 100-1200 and/or architectures 1300-2000. For example, architecture 2400 may be current to voltage convertor 2105. Architecture 2400 may be any of examples 2402, 2404 or 2406 of a current to voltage convertor.

For example, since in architecture 2100, corrections for inaccuracies in resistors, capacitors or even nonlinear conversion can be corrected for in the digital domain, various circuits can be used for converting the output currents into voltage at converter 2105, such as those of architecture 2400. These circuits use an inverting configuration of an opamp with different types of feedback elements. They also have the option of changing or switching between the feedback elements to provide more feedback flexibility.

For instance, example 2402 converts input current I into voltage by applying it to the opamp negative terminal, to produce output voltage Vout, using the feedback from any of three or more switched in capacitors which are placed in parallel with a transistor for resetting the capacitors.

Next, example 2404 converts input current Iin to voltage by applying it to the opamp negative terminal, to produce output voltage Vout, using the feedback from any of three or more switched in resistors. Now, example 2406 converts input current Iin to voltage by applying it to the opamp negative terminal, to produce output voltage Vout, using the transistor feedback. When using a transistor as a feedback element in examples 2406, the conversion of current to voltage will be nonlinear. However, this can be compensated or corrected for in the digital domain, for example by using a lookup table to provide the correction.

Figure 25:
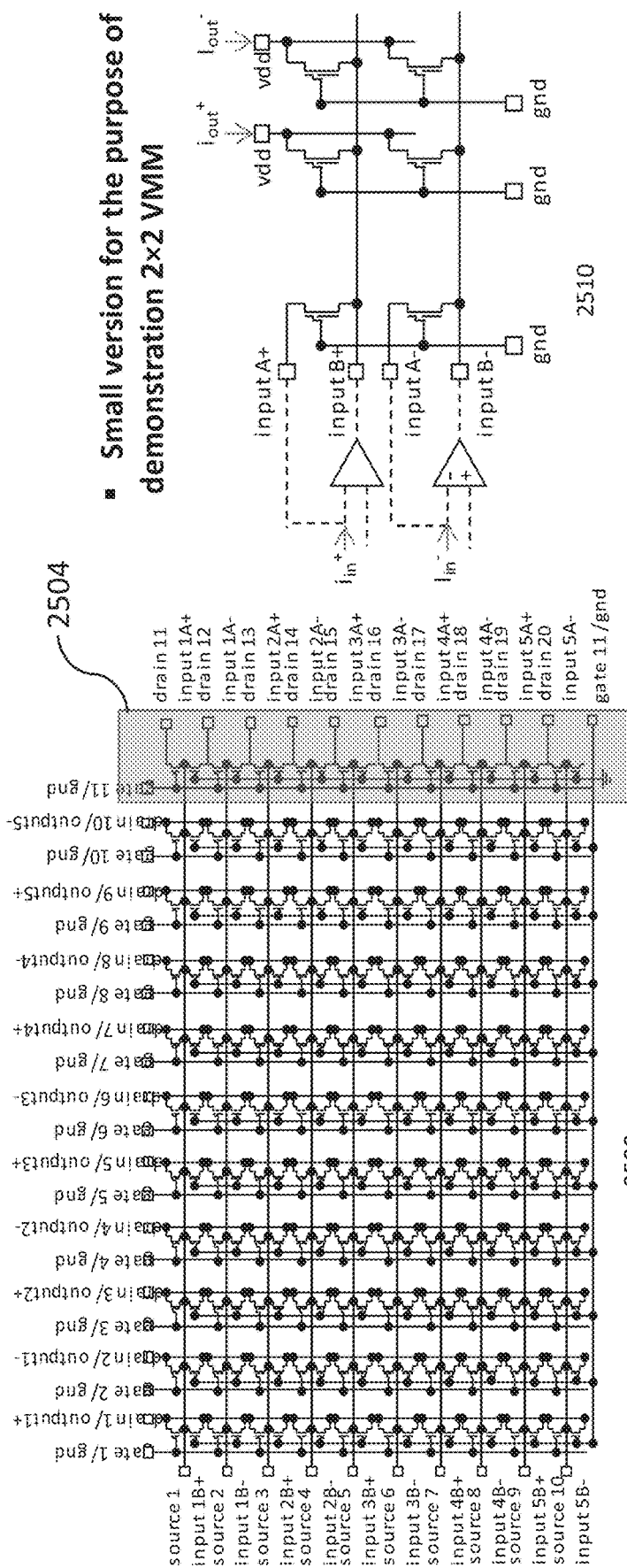
FIG. 25 is an architecture for performing source-coupled VMM using nonvolatile memory array of FG transistors.

FIG. 25 is an architecture 2500 for performing VMM. For example, architecture 2500 may be a more detailed example of the architecture which can be used as blocks 2103 or 2104 in FIG. 21.

It is noted that in architecture 2500, the last column 2504 holds flash transistors which can be used as feedback transistors in current to voltage converter circuitry. In some cases, these transistors are only used or needed in one of the arrays of 2103-2104, and the other arrays do not need to have this column, thus saving space on the chip and reducing circuitry required.

FIG. 25 also shows architecture 2510 which may be a small version or a portion of architecture 2500 for the purpose of demonstration using a 2×2 VMM.

The figures and descriptions herein depict matrix configurations of components and specific electrical connections (or couplings) between the components as shown or described. It is understood that the components may be located or disposed in hardware (e.g., in a physical device or integrated circuit chip as arrays of the components) in the configurations shown or described. In other cases, the components may be physically located at different locations than those shown or described, but be electrically connected as shown or described to form the matrix configurations.

As noted herein, there are various benefits and new concepts of the modules and architectures, such as due to the structure and routing of the activation, input and output signals being easily implemented for NNs and/or in hardware or IC chip layouts.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A vector-by-matrix multiplier (VMM) module comprising:
    a three-dimensional (3D) memory matrix of nonvolatile memory devices each having a charge storage, an activation input, a signal input to receive an input signal and signal output to output an output signal when the activation input receives an activation signal,
    the output signal being in a range that is based on a charge stored in the charge storage, the activation signal applied to the activation input, and the input signal received at the signal input;
    the nonvolatile memory devices arranged in a plurality of two dimensional (2D) (XY) layers that are vertically disposed along a plurality of (Z) columns, the activation inputs of memory devices of each layer connected to a same activation input signal, the memory devices of each layer having signal inputs connected to signal outputs of memory devices in the layer above along a third dimension (Z) and having signal outputs connected to the signal inputs of memory devices in the layer below along the third dimension (Z), wherein:
        VMM module inputs are signal inputs of a top 2D layer of the memory devices connected together along the second dimension (Y);
        VMM module outputs are signal outputs of a bottom 2D layer of the memory devices connected together along the first dimension (X); and
        each two-dimensional (2D) (XY) layer that is vertically disposed along a plurality of (Z) columns can be selected by the application of a proper input to the same activation input of that layer and the application of a larger input to the same activation inputs of other layers.

2. The module of claim 1, wherein when the same activation input of a selected layer receives the activation signal, the VMM module outputs of the bottom layer output signals that are the vector-by-matrix multiplication of weights stored in the nonvolatile memory devices of the selected layer which are proportional to the charges stored in their charge storages and the input signals received at the VMM module inputs of the top layer.

3. The module of claim 1, wherein the module outputs add the signal outputs of every other column of the nonvolatile memory devices of rows in the first dimension (X) of bottom layer; and
    wherein the output circuitry subtracts the added signal outputs of every other column of the nonvolatile memory devices of rows in the first dimension (X) of the bottom layer from the added signal outputs of the prior column of the nonvolatile memory devices of rows in the first dimension (X) of that layer.

4. The module of claim 3, wherein the VMM module inputs are drain terminals of a top 2D layer of the memory devices connected together along bit lines (BLs) along the second dimension (Y), and the VMM module outputs are source terminals of a bottom 2D layer of the memory devices connected together along source lines (SLs) along the first dimension (X).

5. The module of claim 3, further comprising:
    activation circuitry to provide the activation signal to bias the FGTs in a read mode so there would be no change in the charge storage of the FGTs and so that the FGTs operate in analog mode to have output signals in a linear range with respect to the dot products of the weight stored in the charge storage and the input signal received at the signal input of each of the memory devices.

6. The module of claim 1, further comprising:
    input circuitry to input each of a set of input signals into corresponding ones of the set of the same VMM module inputs along the first dimension (X) of memory devices; and
    the output circuitry to connect the VMM module signal outputs connected in series of the rows of the memory devices in the first dimension (X) into a neural path outputs of a neural network.

7. The module of claim 1, wherein the nonvolatile memory devices are floating gate transistors (FGTs); the stored charges are floating gate charges; the input signals are drain inputs, the output signals are source outputs and the activation inputs are gate or world-line inputs.

8. The module of claim 1, wherein the VMM module further comprises programming circuitry to write the charges stored into the charge storages based on parameters of a neural network implemented using the VMM module and trained with a training dataset.

* * * * *